United States Patent
Yu et al.

(10) Patent No.: US 12,442,978 B2
(45) Date of Patent: Oct. 14, 2025

(54) PHOTONIC PACKAGE AND METHOD OF MANUFACTURE

(71) Applicant: Taiwan Semiconductor Manufacturing Co., Ltd., Hsinchu (TW)

(72) Inventors: Chen-Hua Yu, Hsinchu (TW); Hsing-Kuo Hsia, Jhubei (TW); Kuo-Chiang Ting, Hsinchu (TW); Jiun Yi Wu, Zhongli (TW); Hung-Yi Kuo, Taipei (TW); Shang-Yun Hou, Jubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/741,308

(22) Filed: Jun. 12, 2024

(65) Prior Publication Data

US 2024/0329302 A1    Oct. 3, 2024

Related U.S. Application Data

(63) Continuation of application No. 17/340,363, filed on Jun. 7, 2021, now Pat. No. 12,038,599.

(Continued)

(51) Int. Cl.
*G02B 6/12*    (2006.01)
*H01L 23/00*    (2006.01)
(Continued)

(52) U.S. Cl.
CPC ......... *G02B 6/12004* (2013.01); *H01L 24/19* (2013.01); *H01L 24/20* (2013.01); *H01L 25/167* (2013.01); *H01L 25/18* (2013.01); *H10F 77/413* (2025.01); *H10F 77/93* (2025.01); *H01L 24/08* (2013.01); *H01L 24/32* (2013.01);
(Continued)

(58) Field of Classification Search
CPC ..... G02B 6/12004; H01L 24/19; H01L 24/20; H01L 24/80; H01L 25/167; H01L 25/18; H01L 31/02002; H01L 31/02327
See application file for complete search history.

(56) References Cited

U.S. PATENT DOCUMENTS 8,993,380 B2    3/2015    Hou et al.
9,281,254 B2    3/2016    Yu et al.
(Continued)

FOREIGN PATENT DOCUMENTS

TW    202002052 A    1/2020

*Primary Examiner* — Tina Wong
(74) *Attorney, Agent, or Firm* — Slater Matsil, LLP

(57) ABSTRACT

A package includes silicon waveguides on a first side of an oxide layer; photonic devices on the first side of the oxide layer, wherein the photonic devices are coupled to the silicon waveguides; redistribution structures over the first side of the oxide layer, wherein the redistribution structures are electrically connected to the photonic devices; a hybrid interconnect structure on a second side of the oxide layer, wherein the hybrid interconnect structure includes a stack of silicon nitride waveguides that are separated by dielectric layers; and through vias extending through the hybrid interconnect structure and the oxide layer, wherein the through vias make physical and electrical connection to the redistribution structures.

20 Claims, 40 Drawing Sheets

Related U.S. Application Data

(60) Provisional application No. 63/084,051, filed on Sep. 28, 2020.

(51) Int. Cl.
  *H01L 25/16* (2023.01)
  *H01L 25/18* (2023.01)
  *H10F 77/00* (2025.01)
  *H10F 77/40* (2025.01)

(52) U.S. Cl.
  CPC .... *H01L 24/80* (2013.01); *H01L 2224/08145* (2013.01); *H01L 2224/211* (2013.01); *H01L 2224/32145* (2013.01); *H01L 2224/80895* (2013.01); *H01L 2224/80896* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,777,430 B2 | 9/2020 | Yu et al. |
| 12,038,599 B2 * | 7/2024 | Yu ................ G02B 6/12004 |
| 2018/0314003 A1 * | 11/2018 | Coolbaugh ......... G02B 6/4232 |
| 2019/0311983 A1 * | 10/2019 | Raorane ................ H01L 23/00 |
| 2020/0166720 A1 * | 5/2020 | Charles ............... G02B 6/4245 |

* cited by examiner

PHOTONIC PACKAGE AND METHOD OF MANUFACTURE

PRIORITY CLAIM AND CROSS-REFERENCE

This application is a continuation of U.S. application Ser. No. 17/340,363, filed on Jun. 7, 2021, which claims the benefits of U.S. Provisional Application No. 63/084,051, filed on Sep. 28, 2020, each application is hereby incorporated herein by reference in its entirety.

BACKGROUND

Electrical signaling and processing are one technique for signal transmission and processing. Optical signaling and processing have been used in increasingly more applications in recent years, particularly due to the use of optical fiber-related applications for signal transmission.

Optical signaling and processing are typically combined with electrical signaling and processing to provide full-fledged applications. For example, optical fibers may be used for long-range signal transmission, and electrical signals may be used for short-range signal transmission as well as processing and controlling. Accordingly, devices integrating optical components and electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
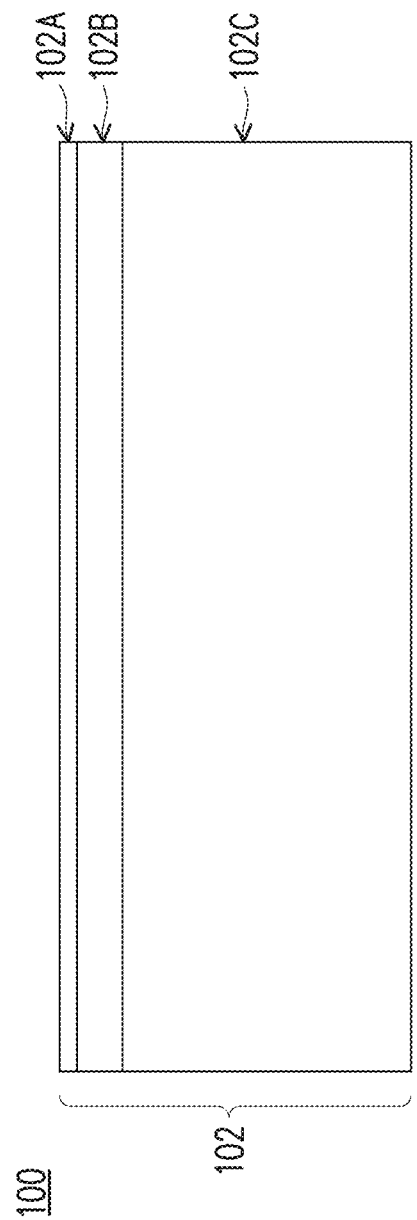
FIGS. 1 through 23 illustrate cross-sectional views of intermediate steps of forming a photonic package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a photonic package and the formation thereof are described. Three-dimensional (3D) packages including both optical devices and electrical devices, and the method of forming the same are provided, in accordance with some embodiments. In particular, one or more electronic dies are formed over a hybrid interconnect structure that includes both electrical and optical communications networks. The optical network of the hybrid interconnect structure may include different types of waveguides and photonic components such as photodetectors, modulators, laser diodes, and the like. In some embodiments, a stack of hybrid interconnect structures are bonded to form a photonic system with multiple electrical and optical networks. The intermediate stages of forming the photonic packages are illustrated, in accordance with some embodiments. Some variations of some embodiments are discussed. Throughout the various views and illustrative embodiments, like reference numbers are used to designate like elements.

FIGS. 1 through 23 show cross-sectional views of intermediate steps of forming a photonic package 100 (see FIG. 23), in accordance with some embodiments. The photonic package 100 may be part of a computing system (e.g., the photonic system 200 described below for FIG. 24 or the like). In some embodiments, the photonic package 100 provides an input/output (I/O) interface between optical signals and electrical signals in a computing system. In some embodiments, the photonic package 100 provides an optical network for signal communication between components (e.g., photonic devices, integrated circuits, couplings to external fibers, etc.) within the photonic package 100.

Turning first to FIG. 1, a buried oxide ("BOX") substrate 102 is provided, in accordance with some embodiments. The BOX substrate 102 includes an oxide layer 102B formed over a substrate 102C, and a silicon layer 102A formed over the oxide layer 102B. The substrate 102C may be, for example, a material such as a glass, ceramic, dielectric, a semiconductor, the like, or a combination thereof. In some embodiments, the substrate 102C may be a semiconductor substrate, such as a bulk semiconductor or the like, which may be doped (e.g., with a p-type or an n-type dopant) or undoped. The substrate 102C may be a wafer, such as a silicon wafer (e.g., a 12-inch silicon wafer). Other substrates, such as a multi-layered or gradient substrate may also be used. In some embodiments, the semiconductor material of the substrate 102C may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The oxide layer 102B may be, for example, a silicon oxide or the like. In some embodiments, the oxide layer 102B may have a thickness between about 0.5 μm and about 4 μm, in some embodiments. The silicon layer 102A may have a thickness between about 0.1 μm and about 1.5 μm, in some embodiments. Other thicknesses are possible. The BOX substrate 102 may be referred to as having a front side or front surface (e.g., the side facing upwards in FIG. 1), and a back side or back surface (e.g., the side facing downwards in FIG. 1).

Figure 2:
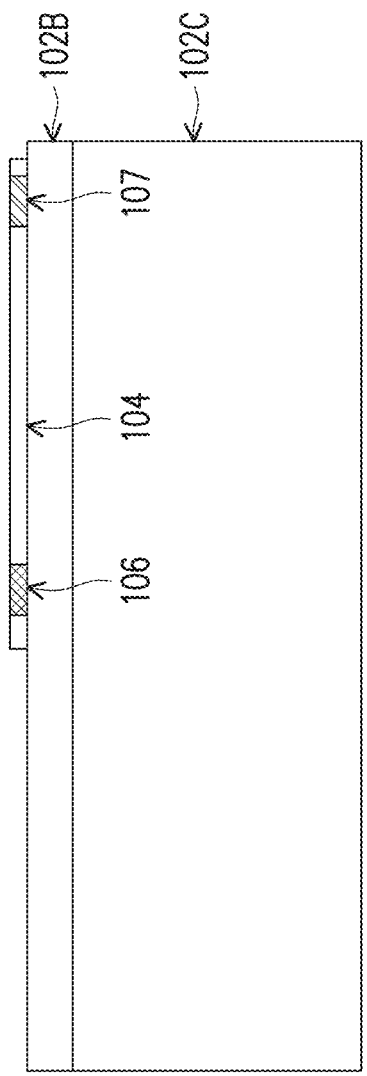

In FIG. 2, the silicon layer 102A is patterned to form silicon regions for waveguides 104, photonic components 106, and grating couplers 107, in accordance with some embodiments. The silicon layer 102A may be patterned using suitable photolithography and etching techniques. For example, a hardmask layer (e.g., a nitride layer or other dielectric material, not shown in FIG. 2) may be formed over the silicon layer 102A and patterned, in some embodiments. The pattern of the hardmask layer may then be transferred to the silicon layer 102A using an etching process. The etching process may include, for example, a dry etching process and/or a wet etching process. For example, the silicon layer 102A may be etched to form recesses defining the waveguides 104, with sidewalls of the remaining unrecessed portions defining sidewalls of the waveguides 104. In some embodiments, more than one photolithography and etching sequence may be used in order to pattern the silicon layer 102A. One waveguide 104 or multiple waveguides 104 may be patterned from the silicon layer 102A. If multiple waveguides 104 are formed, the multiple waveguides 104 may be individual separate waveguides 104 or connected as a single continuous structure. In some embodiments, one or more of the waveguides 104 form a continuous loop. Other configurations or arrangements of waveguides 104, the photonic components 106, or the grating couplers 107 are possible, and other types of photonic components 106 or photonic structures may be formed. In some cases, the waveguides 104, the photonic components 106, and the grating couplers 107 may be collectively referred to as "the photonic layer."

The photonic components 106 may be integrated with the waveguides 104, and may be formed with the silicon waveguides 104. The photonic components 106 may be optically coupled to the waveguides 104 to interact with optical signals within the waveguides 104. The photonic components 106 may include, for example, photonic devices such as photodetectors and/or modulators. For example, a photodetector may be optically coupled to the waveguides 104 to detect optical signals within the waveguides 104 and generate electrical signals corresponding to the optical signals. A modulator may be optically coupled to the waveguides 104 to receive electrical signals and generate corresponding optical signals within the waveguides 104 by modulating optical power within the waveguides 104. In this manner, the photonic components 106 facilitate the input/output (I/O) of optical signals to and from the waveguides 104. In other embodiments, the photonic components may include other active or passive components, such as laser diodes, optical signal splitters, or other types of photonic structures or devices. Optical power may be provided to the waveguides 104 by, for example, an optical fiber 210 (see FIG. 24) coupled to an external light source, or the optical power may be generated by a photonic component within the photonic package 100 such as a laser diode 140 (see FIG. 17).

In some embodiments, the photodetectors may be formed by, for example, partially etching regions of the waveguides 104 and growing an epitaxial material on the remaining silicon of the etched regions. The waveguides 104 may be etched using acceptable photolithography and etching techniques. The epitaxial material may comprise, for example, a semiconductor material such as germanium (Ge), which may be doped or undoped. In some embodiments, an implantation process may be performed to introduce dopants within the silicon of the etched regions as part of the formation of the photodetectors. The silicon of the etched regions may be doped with p-type dopants, n-type dopants, or a combination. In some embodiments, the modulators may be formed by, for example, partially etching regions of the waveguides 104 and then implanting appropriate dopants within the remaining silicon of the etched regions. The waveguides 104 may be etched using acceptable photolithography and etching techniques. In some embodiments, the etched regions used for the photodetectors and the etched regions used for the modulators may be formed using one or more of the same photolithography or etching steps. The silicon of the etched regions may be doped with p-type dopants, n-type dopants, or a combination. In some embodiments, the etched regions used for the photodetectors and the etched regions used for the modulators may be implanted using one or more of the same implantation steps.

In some embodiments, one or more grating couplers 107 may be integrated with the waveguides 104, and may be formed with the waveguides 104. The grating couplers 107 are photonic structures that allow optical signals and/or optical power to be transferred between the waveguides 104 and a photonic component such as a vertically-mounted optical fiber (e.g., the optical fiber 210A shown in FIG. 24) or a waveguide of another photonic system. The grating couplers 107 may be formed using acceptable photolithography and etching techniques. In an embodiment, the grating couplers 107 are formed after the waveguides 104 are defined. For example, a photoresist may be formed on the waveguides 104 and patterned. The photoresist may be patterned with openings corresponding to the grating couplers 107. One or more etching processes may be performed using the patterned photoresist as an etching mask to form recesses in the waveguides 104 that define the grating couplers 107. The etching processes may include one or more dry etching processes and/or wet etching processes. In some embodiments, other types of couplers (not individually labeled in the figures) may be formed, such as a structure that couples optical signals between the waveguides 104 and other waveguides of the photonic package 100, such as nitride waveguides 134 (see FIG. 14). Edge couplers may also be formed that allow optical signals and/or optical power to be transferred between the waveguide 104 and a photonic component that is horizontally mounted near a sidewall of the photonic package 100, such as an edge-mounted optical fiber (e.g., the optical fiber 210B shown in FIG. 24). These and other photonic structures are considered within the scope of the present disclosure.

Figure 3:
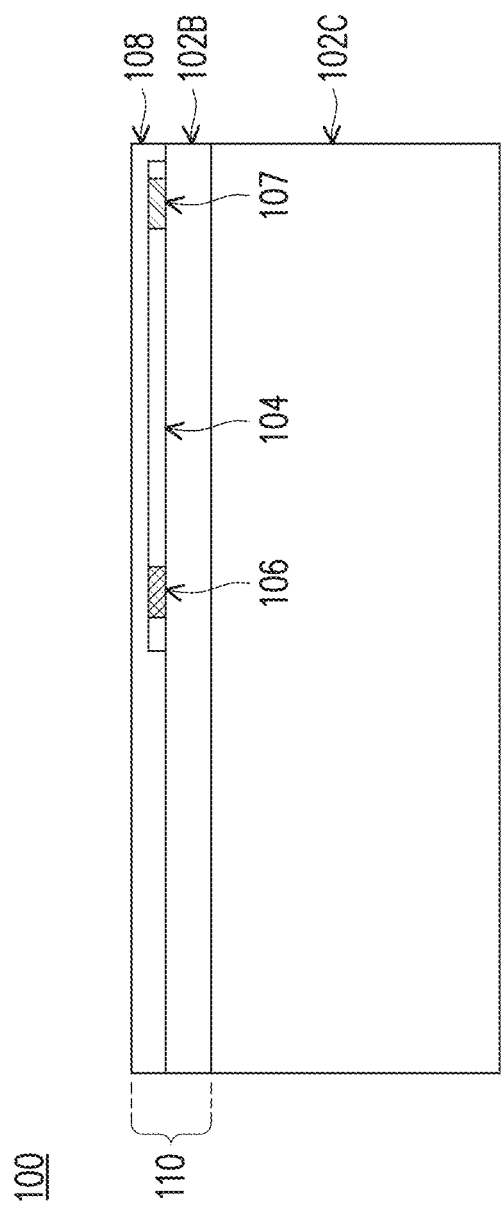

In FIG. 3, a dielectric layer 108 is formed on the front side of the BOX substrate 102 to form a photonic routing structure 110, in accordance with some embodiments. The dielectric layer 108 is formed over the waveguides 104, the photonic components 106, the grating couplers 107, and the oxide layer 102B. The dielectric layer 108 may be formed of one or more layers of silicon oxide, silicon nitride, a combination thereof, or the like, and may be formed by CVD, PVD, atomic layer deposition (ALD), a spin-on-dielectric process, the like, or a combination thereof. In some embodiments, the dielectric layer 108 may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other dielectric materials formed by any acceptable process may be used. In some embodiments, the dielectric layer 108 is then planarized using a planarization process such as a CMP process, a grinding process, or the like. The dielectric layer 108 may be formed having a thickness over the oxide layer 102B between about 50 nm and about 500 nm, or may be formed having a thickness over the waveguides 104 between about 10 nm and about 200 nm, in some embodiments. In some cases, a thinner dielectric layer 108 may allow for more efficient optical coupling between a grating coupler 107 and a vertically-mounted photonic component.

Due to the difference in refractive indices of the materials of the waveguides 104 and dielectric layer 108, the waveguides 104 have high internal reflections such that light is substantially confined within the waveguides 104, depending on the wavelength of the light and the refractive indices of the respective materials. In an embodiment, the refractive index of the material of the waveguides 104 is higher than the refractive index of the material of the dielectric layer 108. For example, the waveguides 104 may comprise silicon, and the dielectric layer 108 may comprise silicon oxide and/or silicon nitride.

Figure 4:
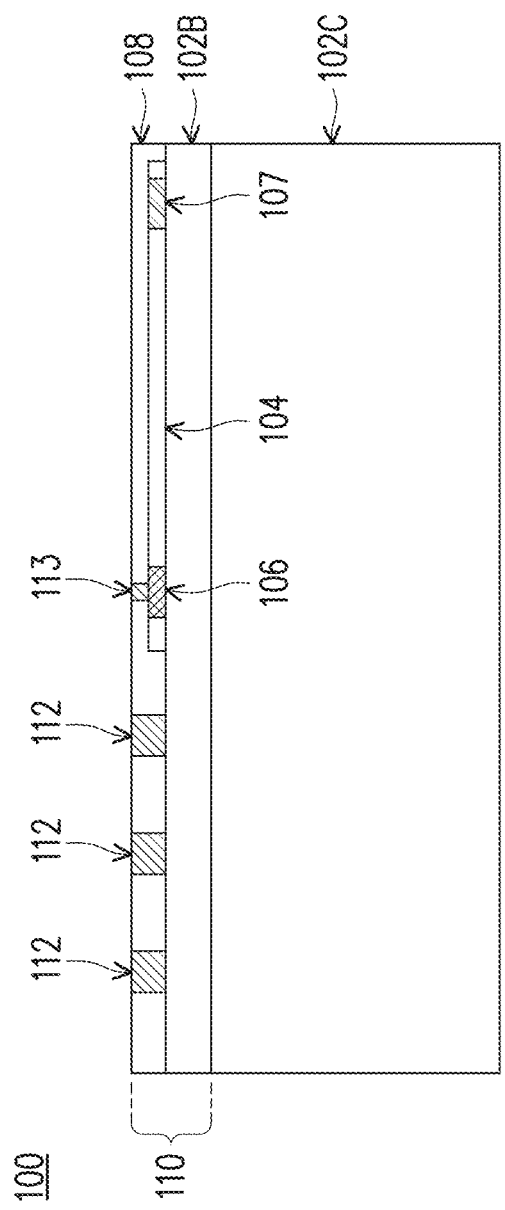

In FIG. 4, vias 112 and contacts 113 are formed in the dielectric layer 108, in accordance with some embodiments. In some embodiments, the vias 112 and contacts 113 are formed as part of forming the redistribution structure 120 (see FIG. 5), and in other embodiments, the vias 112 are not formed. In some embodiments, the vias 112 are formed by a damascene process, e.g., single damascene, dual damascene, or the like. The vias 112 may be formed, for example, by forming openings extending through the dielectric layer 108. In some embodiments, the openings may extend partially into the oxide layer 102B or fully through the oxide layer 102B to expose the substrate 102C. In some embodiments, the openings may extend partially into the substrate 102C. The openings may be formed using acceptable photolithography and etching techniques, such as by forming and patterning a photoresist and then performing an etching process using the patterned photoresist as an etching mask. The etching process may include, for example, a dry etching process and/or a wet etching process.

A conductive material may then be formed in the openings, thereby forming vias 112, in accordance with some embodiments. In some embodiments, a liner (not shown), such as a diffusion barrier layer, an adhesion layer, or the like, may be formed in the openings from TaN, Ta, TiN, Ti, CoW, or the like, and may be formed using suitable a deposition process such as ALD or the like. In some embodiments, a seed layer (not shown), which may include copper or a copper alloy may then be deposited in the openings. The conductive material of the vias 112 may be formed in the openings using, for example, a plating process. The conductive material may include, for example, a metal or a metal alloy such as copper, silver, gold, tungsten, cobalt, aluminum, or alloys thereof. A planarization process (e.g., a CMP process or a grinding process) may be performed to remove excess conductive material along the top surface of the dielectric layer 108, such that top surfaces of the vias 112 and the dielectric layer 108 are level. The vias 112 may be formed using other techniques or materials in other embodiments.

In some embodiments, the contacts 113 extend through the dielectric layer 108 and are electrically connected to the photonic components 106. The contacts 113 allow electrical power or electrical signals to be transmitted to the photonic components 106 and electrical signals to be transmitted from the photonic components 106. In this manner, the photonic components 106 may convert electrical signals into optical signals transmitted by the waveguides 104, and/or may convert optical signals from the waveguides 104 into electrical signals. The contacts 113 may be formed before or after formation of the vias 112, and the formation of the contacts 113 and the formation of the vias 112 may share some steps such as deposition of the conductive material and/or planarization. In some embodiments, the contacts 113 are formed by a damascene process, e.g., single damascene, dual damascene, or the like. For example, in some embodiments, openings (not shown) for the contacts 113 are first formed in the dielectric layer 108 using acceptable photolithography and etching techniques. A conductive material may then be formed in the openings, forming the contacts 113. Excess conductive material may be removed using a CMP process or the like. The conductive material of the contacts 113 may be formed of a metal or a metal alloy including aluminum, copper, tungsten, or the like, which may be the same as that of the vias 112. The contacts 113 may be formed using other techniques or materials in other embodiments.

Figure 5:
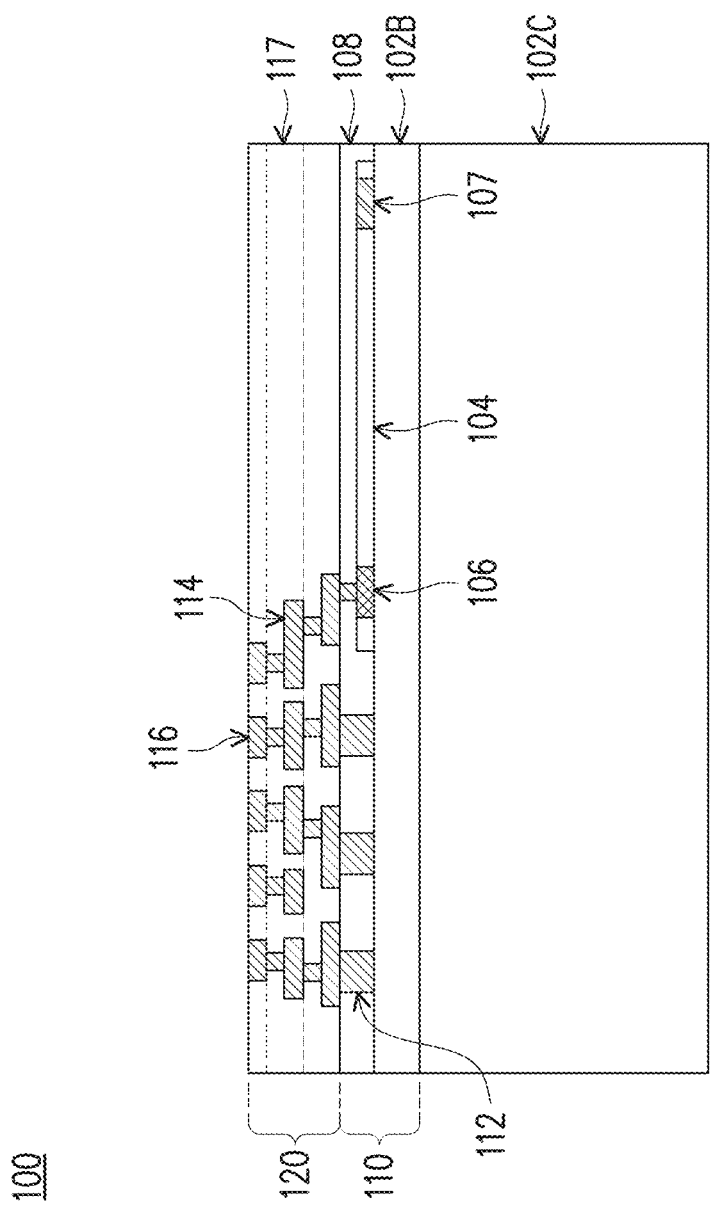

In FIG. 5, a redistribution structure 120 is formed over the dielectric layer 108, in accordance with some embodiments. The redistribution structure 120 includes dielectric layers 117 and conductive features 114 formed in the dielectric layers 117 that provide interconnections and electrical routing. For example, the redistribution structure 120 may connect the vias 112, the contacts 113, and/or overlying devices such as electronic dies 122 (see FIG. 8). The dielectric layers 117 may be, for example, insulating or passivating layers, and may comprise one or more materials similar to those described above for the dielectric layer 108, such as a silicon oxide or a silicon nitride, or may comprise a different material. The dielectric layers 117 and the dielectric layer 108 may be transparent or nearly transparent to light within the same range of wavelengths. The dielectric layers 117 may be formed using a technique similar to those described above for the dielectric layer 108 or using a different technique. The conductive features 114 may include conductive lines and vias, and may be formed by a damascene process, e.g., single damascene, duel damascene, or the like. As shown in FIG. 5, conductive pads 116 are formed in the topmost layer of the dielectric layers 117. A planarization process (e.g., a CMP process or the like) may be performed after forming the conductive pads 116 such that surfaces of the conductive pads 116 and the topmost dielectric layer 117 are substantially coplanar. The redistribution structure 120 may include more or fewer dielectric layers 117, conductive features 114, or conductive pads 116 than shown in FIG. 5. The redistribution structure 120 may be formed having a thickness between about 4 μm and about 8 μm, in some embodiments. Other thicknesses are possible.

Figure 6:
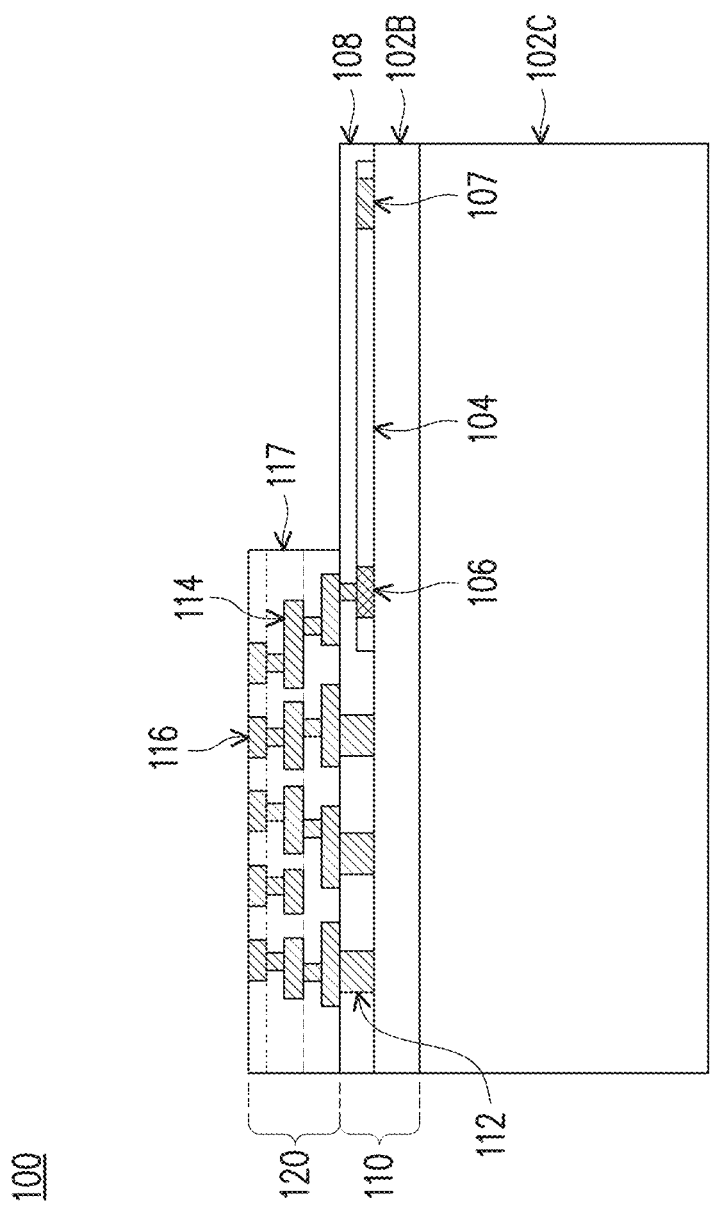
Figure 7:
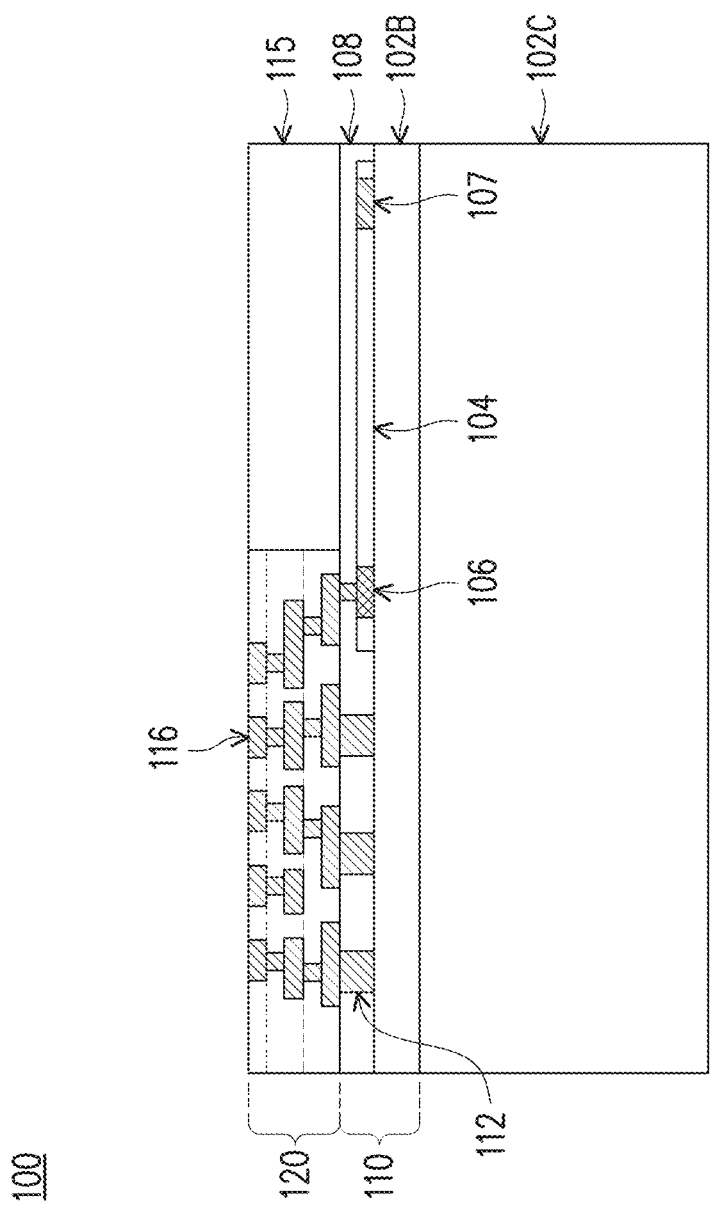

In FIGS. 6 and 7, a portion of the redistribution structure 120 is removed and replaced by a dielectric layer 115, in accordance with some embodiments. The removed portion of the redistribution structure 120 may be above or approximately above a grating coupler 107, in some cases. The material of the dielectric layer 115 may provide more efficient optical coupling between a grating coupler 107 and a vertically-mounted optical fiber (see optical fiber 210A in FIG. 24) than the material of the dielectric layers 117 of the redistribution structure 120. For example, the dielectric layer 115 may be more transparent, less lossy, or less reflective than the dielectric layers 117. In some embodiments, the material of the dielectric layer 115 is similar to that of the dielectric layers 117, but is deposited using a technique that forms the material having a better quality (e.g., less impurities, dislocations, etc.). In this manner, replacing a portion of the dielectric layers 117 of the redistribution structure 120 with the dielectric layer 115 may allow for more efficient operation of the photonic package 100, and may reduce optical signal loss.

Referring to FIG. 6, the portion of the redistribution structure 120 may be removed, for example, using acceptable photolithography and etching techniques, such as by forming and patterning a photoresist and then performing an etching process to remove the dielectric layers 117 using the patterned photoresist as an etching mask. The etching process may include, for example, a dry etching process and/or a wet etching process.

Turning to FIG. 7, the dielectric layer 115 is deposited to replace the removed portion of the redistribution structure 120. The dielectric layer 115 may comprise one or more materials similar to those described above for the dielectric layer 108, such as a silicon oxide or a silicon nitride, a spin-on glass, or a different material. The dielectric layer 115 and the dielectric layer 108 may be transparent or nearly transparent to light within the same range of wavelengths. The dielectric layer 115 may be formed using a technique similar to those described above for the dielectric layer 108 or using a different technique. For example, the dielectric layer 115 may be formed using CVD, PVD, spin-on, or the like, though another technique may be used. In some embodiments, a planarization process (e.g., a CMP or grinding process) is used to remove excess material of the dielectric layer 115. The planarization process may also expose the conductive pads 116. After performing the planarization process, the dielectric layer 115, the topmost dielectric layer 117, and/or the conductive pads 116 may have substantially level surfaces.

In other embodiments, the redistribution structure 120 is not etched and the dielectric layer 115 is not formed. In these embodiments, regions of the redistribution structure 120 may be substantially free of the conductive features 114 or conductive pads 116 in order to allow transmission of optical power or optical signals through the dielectric layers 117. For example, these metal-free regions may extend between a grating coupler 107 and a vertically-mounted optical fiber (see optical fiber 210A in FIG. 24) to allow optical power or optical signals to be coupled between the waveguides 104 and the optical fiber. In some cases, a thinner redistribution structure 120 may allow for more efficient optical coupling between a grating coupler 107 and a vertically-mounted optical fiber 210.

Figure 8:
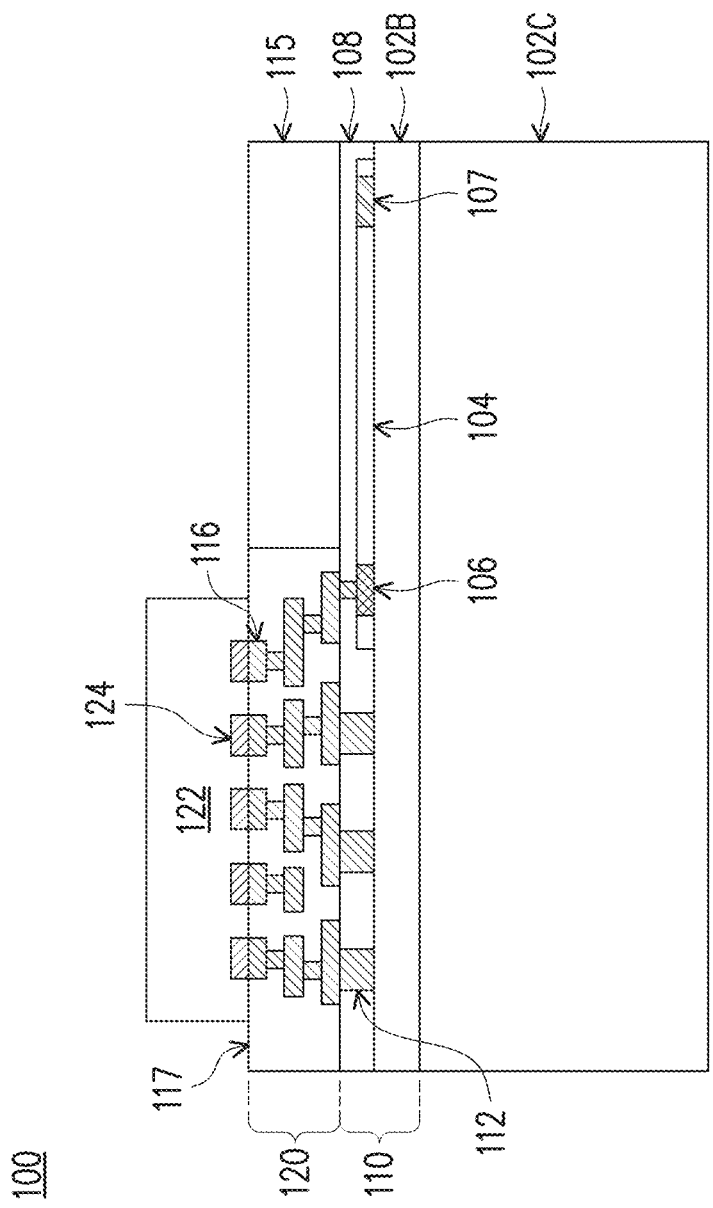

In FIG. 8, one or more electronic dies 122 are bonded to the redistribution structure 120, in accordance with some embodiments. The electronic die 122 may be, for example, semiconductor devices, dies, or chips that communicate with the photonic components 106 using electrical signals. One electronic die 122 is shown in FIG. 8, but a photonic package 100 may include two or more electronic dies 122 in other embodiments. In some cases, multiple electronic dies 122 may be incorporated into a single photonic package 100 in order to reduce processing cost. The electronic die 122 includes die connectors 124, which may be, for example, conductive pads, conductive pillars, or the like. In some embodiments, the electronic die 122 may have a thickness between about 10 μm and about 35 μm, such as about 25 μm. Other thicknesses are possible.

The electronic die 122 may include integrated circuits for interfacing with the photonic components 106, such as circuits for controlling the operation of the photonic components 106. For example, the electronic die 122 may include controllers, drivers, transimpedance amplifiers, the like, or combinations thereof. The electronic die 122 may also include a CPU, in some embodiments. In some embodiments, the electronic die 122 includes circuits for processing electrical signals received from photonic components 106, such as for processing electrical signals received from a photonic component 106 comprising a photodetector. The electronic die 122 may control high-frequency signaling of the photonic components 106 according to electrical signals (digital or analog) received from another device or die, in some embodiments. In some embodiments, the electronic die 122 may be an electronic integrated circuit (EIC) or the like that provides Serializer/Deserializer (SerDes) functionality. In this manner, the electronic die 122 may act as part of an I/O interface between optical signals and electrical signals within a photonic package 100. In some embodiments, the photonic packages 100 described herein could be considered system-on-chip (SoC) or system-on-integrated-circuit (SoIC) devices.

In some embodiments, the electronic die 122 is bonded to the redistribution structure 120 by dielectric-to-dielectric bonding and/or metal-to-metal bonding (e.g., direct bonding, fusion bonding, oxide-to-oxide bonding, hybrid bonding, or the like). In such embodiments, covalent bonds may be formed between oxide layers, such as the topmost dielectric layer 117 and surface dielectric layers (not shown) of the electronic die 122. During the bonding, metal bonding may also occur between the die connectors 124 of the electronic die 122 and the conductive pads 116 of the redistribution structure 120.

In some embodiments, before performing the bonding process, a surface treatment is performed on the electronic die 122. In some embodiments, the top surfaces of the redistribution structure 120 and/or the electronic die 122 may first be activated utilizing, for example, a dry treatment, a wet treatment, a plasma treatment, exposure to an inert gas, exposure to $H_2$, exposure to $N_2$, exposure to $O_2$, the like, or combinations thereof. However, any suitable activation process may be utilized. After the activation process, the redistribution structure 120 and/or the electronic die 122 may be cleaned using, e.g., a chemical rinse. The electronic die 122 is then aligned with the redistribution structure 120 and placed into physical contact with the redistribution structure 120. The electronic die 122 may be placed on the redistribution structure 120 using a pick-and-place process, for example. The redistribution structure 120 and the electronic die 122 may then be subjected to a thermal treatment and/or pressed against each other (e.g., by applying contact pressure) to bond the redistribution structure 120 and the electronic die 122. For example, the redistribution structure 120 and the electronic die 122 may be subjected to a pressure of about 200 kPa or less, and to a temperature between about 200° C. and about 400° C. The redistribution structure 120 and the electronic die 122 may then be subjected to a temperature at or above the eutectic point of the material of the conductive pads 116 and the die connectors 124 (e.g., between about 150° C. and about 650° C.) to fuse the conductive pads 116 and the die connectors 124. In this manner, the dielectric-to-dielectric bonding and/or metal-to-metal bonding of the redistribution structure 120 and the electronic die 122 forms a bonded structure. In some embodiments, the bonded structure is baked, annealed, pressed, or otherwise treated to strengthen or finalize the bonds.

Figure 9:
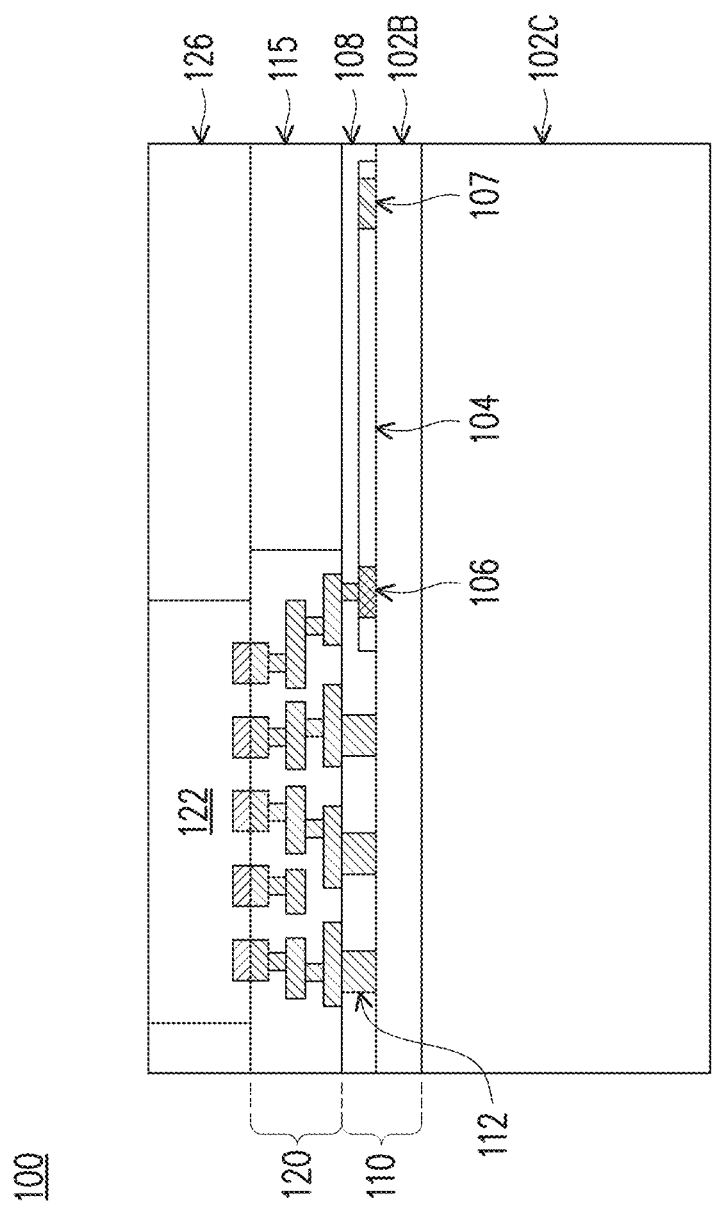

In FIG. 9, a dielectric material 126 is formed over the electronic dies 122 and the redistribution structure 120, in accordance with some embodiments. The dielectric material 126 may be formed of silicon oxide, silicon nitride, a polymer, the like, or a combination thereof. The dielectric material 126 may be formed by CVD, PVD, ALD, a spin-on-dielectric process, the like, or a combination thereof. In some embodiments, the dielectric material 126 may be formed by HDP-CVD, FCVD, the like, or a combination thereof. The dielectric material 126 may be a gap-fill material in some embodiments, which may include one or more of the example materials above. In some embodiments, the dielectric material 126 may be a material (e.g., silicon oxide) that is substantially transparent to light at wavelengths suitable for transmitting optical signals or optical power between a grating coupler 107 and a vertically-mounted optical fiber 210. In some embodiments in which a grating coupler 107 is not present, the dielectric material 126 may comprise a relatively opaque material such as an encapsulant, molding compound, or the like. Other dielectric materials formed by any acceptable process may be used. The dielectric material 126 may be planarized using a planarization process such as a CMP process, a grinding process, or the like. In some embodiments, the planarization process may expose the electronic dies 122 such that surfaces of the electronic dies 122 and surfaces of the dielectric material 126 are coplanar.

The use of dielectric-to-dielectric bonding may allow for materials transparent to the relevant wavelengths of light to be deposited over the redistribution structure 120 and/or around the electronic die 122 instead of opaque materials such as an encapsulant or a molding compound. For example, the dielectric material 126 may be formed from a suitably transparent material such as silicon oxide instead of an opaque material such as a molding compound. The use of a suitably transparent material for the dielectric material 126 in this manner allows optical signals to be transmitted through the dielectric material 126, such as transmitting optical signals between a grating coupler 107 and a vertically-mounted optical fiber 210 located above the dielectric material 126. Additionally, by bonding the electronic die 122 to the redistribution structure 120 in this manner, the thickness of the resulting photonic package 100 may be reduced, and the optical coupling between a grating coupler 107 and a vertically-mounted optical fiber 210 may be improved. In some cases, this can reduce the size or processing cost of a photonic package, and the optical coupling to external components may be improved.

Figure 10:
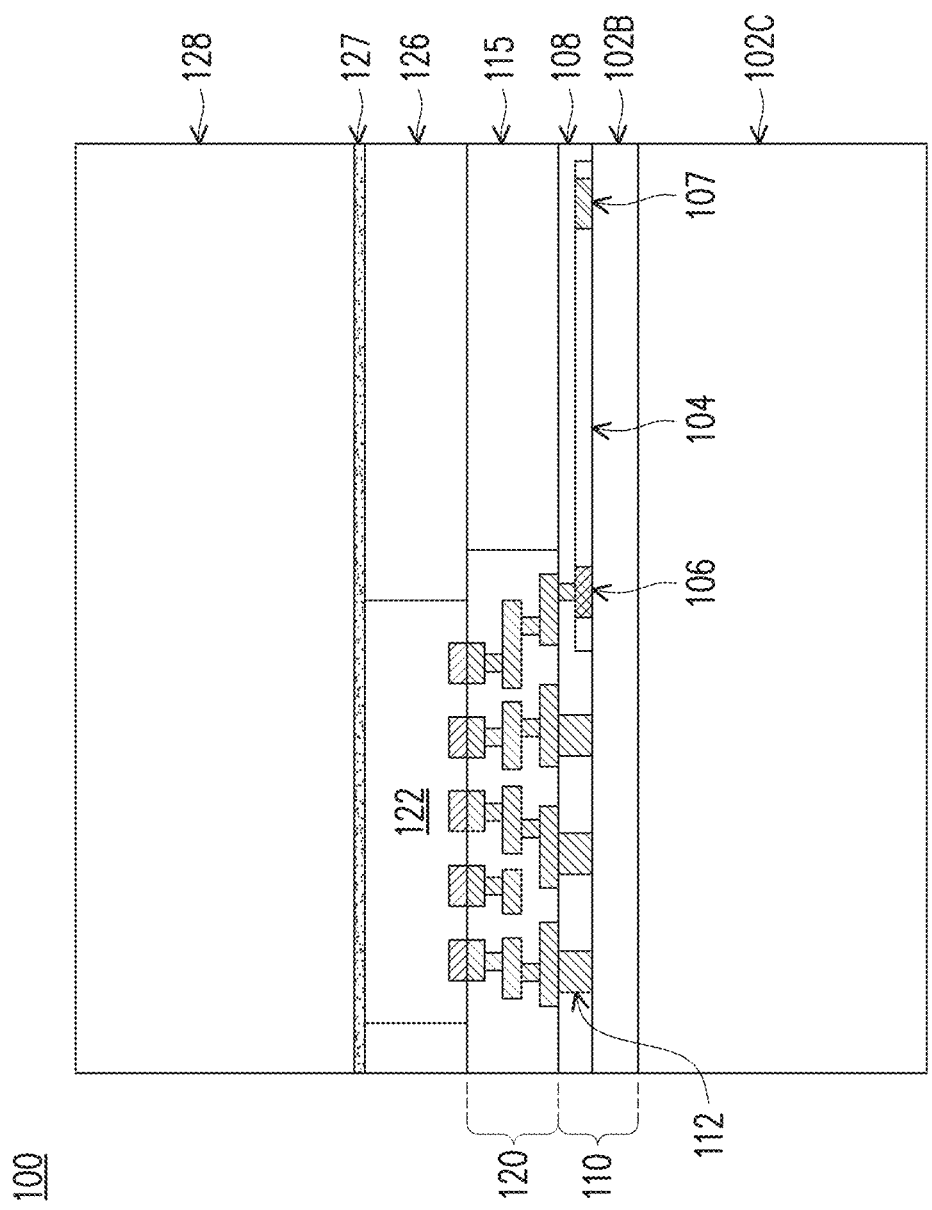

In FIG. 10, an optional support 128 is attached to the structure, in accordance with some embodiments. The support 128 is a rigid structure that is attached to the structure in order to provide structural or mechanical stability. The use of a support 128 can reduce warping or bending, which can improve the performance of the optical structures such as the waveguides 104 or photonic components 106. The support 128 may comprise one or more materials such as silicon (e.g., a silicon wafer, bulk silicon, or the like), a silicon oxide, a metal, an organic core material, the like, or another type of material. The support 128 may be attached to the structure (e.g., to the dielectric material 126 and/or the electronic dies 122) using an adhesive layer 127, as shown in FIG. 10, or the support 128 may be attached using direct bonding or another suitable technique. In some embodiments, the support 128 may have a thickness between about between about 500 μm and about 700 μm. The support 128 may also have lateral dimensions (e.g., length, width, and/or area) that are greater than, about the same as, or smaller than those of the structure. In other embodiments, the support 128 is attached at a later process step during the manufacturing the photonic package 100 than shown.

Figure 11:
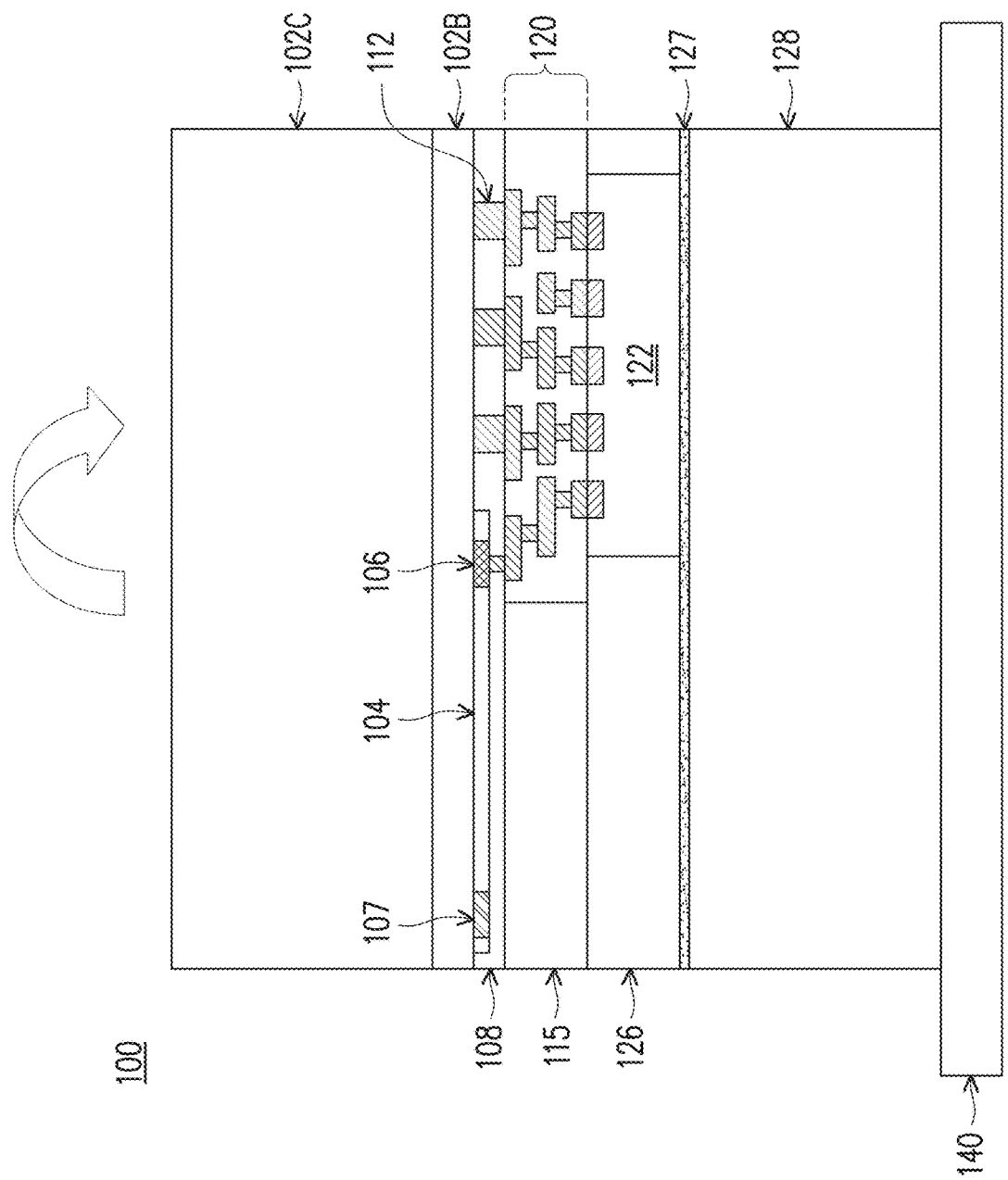

In FIG. 11, the structure is flipped over and attached to a carrier 130, in accordance with some embodiments. The carrier 130 may be, for example, a wafer (e.g., a silicon wafer), a panel, a glass substrate, a ceramic substrate, or the like. The structure may be attached to the carrier 130 using, for example, an adhesive or a release layer (not shown).

Figure 12:
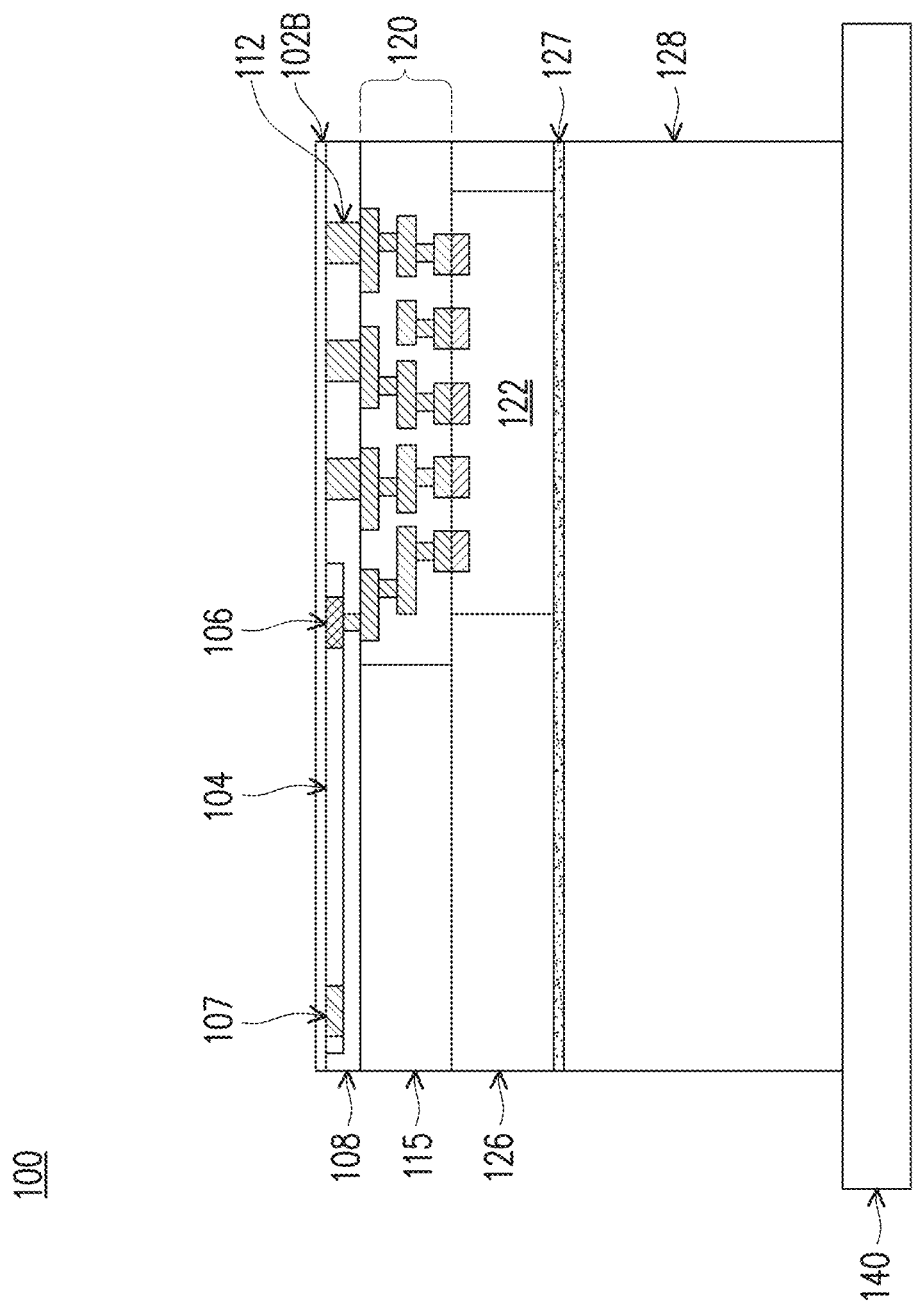

In FIG. 12, the substrate 102C is removed, in accordance with some embodiments. The substrate 102C may be removed using a planarization process (e.g., a CMP or grinding process), an etching process, a combination thereof, or the like. In some embodiments, the oxide layer 102B is also thinned. The oxide layer 102B may be thinned as part of the removal process for the substrate 102C, or the oxide layer 102B may be thinned in a separate step. The oxide layer 102B may be thinned, for example, using a planarization process, an etching process, a combination thereof, or the like. In some embodiments, after thinning, the oxide layer 102B may have a thickness in the range of about 0.1 μm to about 1.0 μm. Other thicknesses are possible. In some cases, thinning the oxide layer 102B may improve optical coupling between a waveguide 104 and a nitride waveguide 134 (see FIG. 14).

Figure 13:
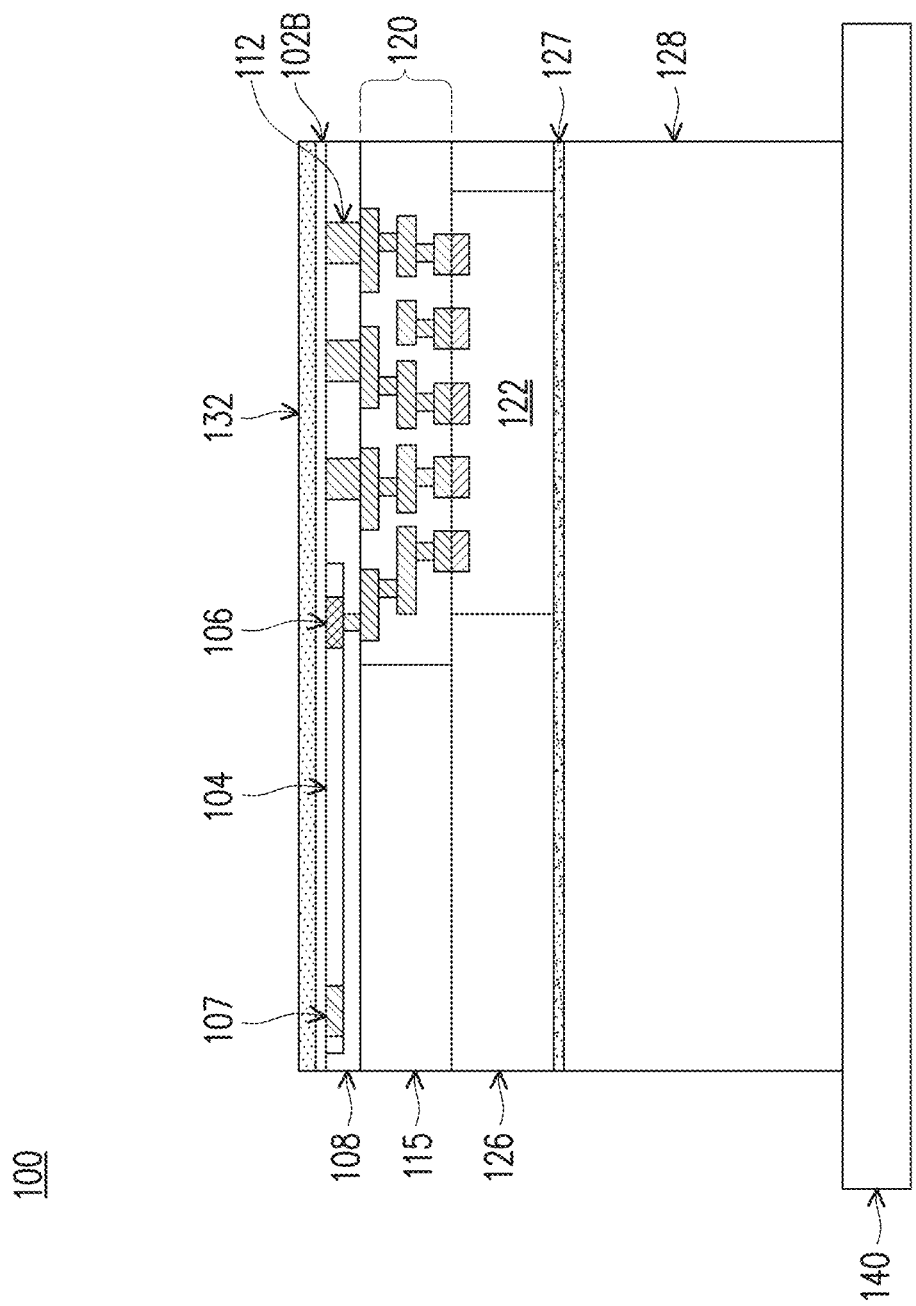
Figure 14:
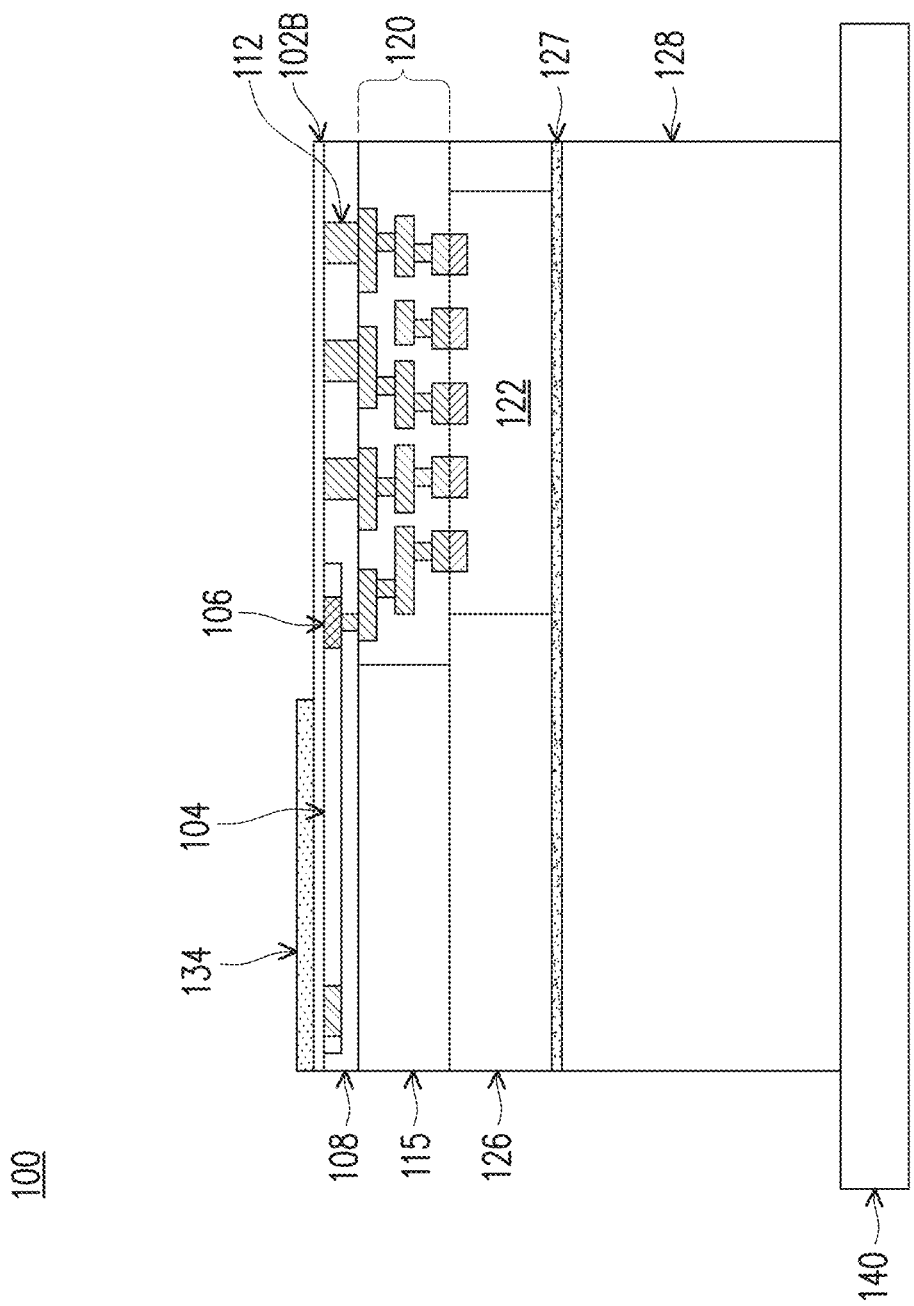

Turning to FIGS. 13 and 14, nitride waveguides 134 are formed over the oxide layer 102B, in accordance with some embodiments. In FIG. 13, a silicon nitride layer 132 is deposited on the oxide layer 102B. The silicon nitride layer 132 may be formed using a suitable deposition technique, such as CVD, PECVD, LPCVD, PVD, or the like. In some embodiments, the silicon nitride layer 132 is formed having a thickness in the range of about 0.2 μm to about 1.0 μm, though other thicknesses are possible.

In FIG. 14, the silicon nitride layer 132 is patterned to form the nitride waveguides 134, in accordance with some embodiments. The nitride waveguide 134 may be patterned using acceptable photolithography and etching techniques. For example, a hardmask layer may be formed over the silicon nitride layer 132 and patterned, in some embodiments. The pattern of the hardmask layer may then be transferred to the silicon nitride layer 132 using an etching process. The etching process may include, for example, a dry etching process and/or a wet etching process. The etching process may be selective to silicon nitride over silicon oxide or other materials. The silicon nitride layer 132 may be etched to form recesses defining the nitride waveguides 134, with sidewalls of the remaining unrecessed portions defining sidewalls of the nitride waveguides 134. In some embodiments, more than one photolithography and etching sequence may be used in order to pattern the silicon nitride layer 132. One nitride waveguide 134 or multiple nitride waveguides 134 may be patterned from the silicon nitride layer 132. If multiple nitride waveguides 134 are formed, the multiple nitride waveguides 134 may be individual separate nitride waveguides 134 or connected as a single continuous structure. In some embodiments, one or more of the nitride waveguides 134 form a continuous loop. In some embodiments, nitride waveguides 134 may include photonic structures such as grating couplers, edge couplers, or couplers (e.g., mode converters) that allow optical signals to be transmitted between two nitride waveguides 134 and/or between a nitride waveguide 134 and a waveguide 104. For example, a nitride waveguide 134 may include an edge coupler that allows optical signals and/or optical power to be transferred between the nitride waveguide 134 and a photonic component that is horizontally mounted near a sidewall of the photonic package 100, such as an edge-mounted optical fiber (e.g., the optical fiber 210B shown in FIG. 24).

In some cases, a waveguide formed from silicon nitride (e.g., nitride waveguides 134) may have advantages over a waveguide formed from silicon (e.g., waveguides 104). For example, silicon nitride has a higher dielectric constant than silicon, and thus a nitride waveguide may have a greater internal confinement of light than a silicon waveguide. This may also allow the performance or leakage of nitride waveguides to be less sensitive to process variations, less sensitive to dimensional uniformity, and less sensitive to surface roughness (e.g., edge roughness or linewidth roughness). In some cases, the reduced process sensitivity may allow nitride waveguides to be easier or less costly to process than silicon waveguides. These characteristics may allow a nitride waveguide to have a lower propagation loss than a silicon waveguide. In some cases, the propagation loss (dB/cm) of a nitride waveguide may be between about 0.1% and about 50% of a silicon waveguide. In some cases, a nitride waveguide may also be less sensitive to the temperature of the environment than a silicon waveguide. For example, a nitride waveguide may have a sensitivity to temperature that is as small as about 1% of that of a silicon waveguide. In this manner, the embodiments described herein can allow for the formation of a photonic package that has both nitride waveguides (e.g., nitride waveguides 134) and silicon waveguides (e.g., waveguides 104).

Figure 15:
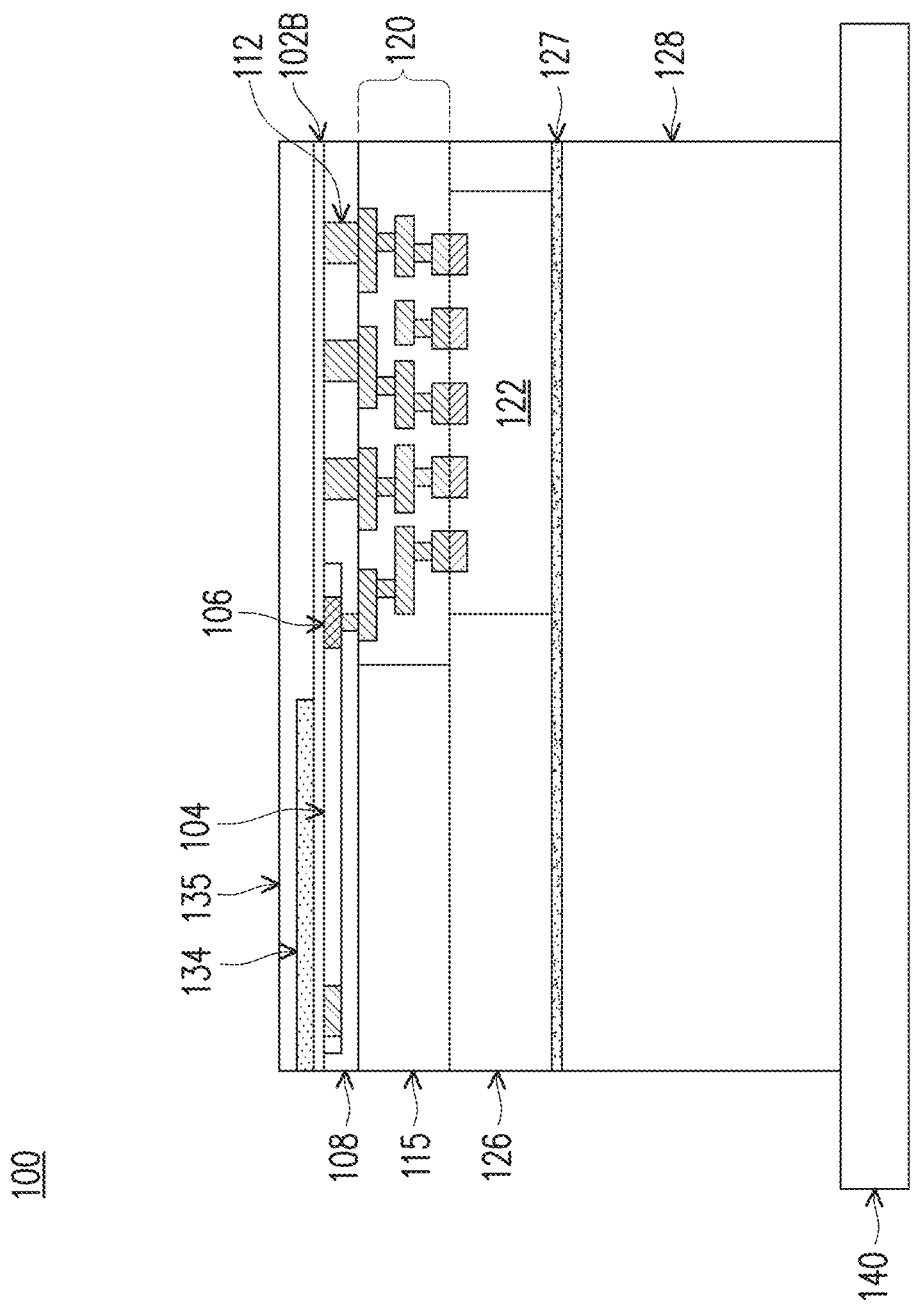

Turning to FIG. 15, a dielectric layer 135 is formed over the nitride waveguides 134, in accordance with some embodiments. The dielectric layer 135 may comprise one or more materials similar to those described above for the dielectric layer 108 or the dielectric layer 115. For example, the dielectric layer 135 may comprise a silicon oxide, spin-on glass, or the like. The dielectric layer 135 may be formed using a technique similar to those described above for the dielectric layer 108 or the dielectric layer 115, or may be formed using a different technique. For example, the dielectric layer 135 may be formed using CVD, PVD, spin-on, or the like, though another technique may be used. In some embodiments, a planarization process (e.g., a CMP or grinding process) is used to remove excess material of the dielectric layer 135. After planarization, the dielectric layer 135 may have a thickness between about 0.5 µm and about 2 µm, in some embodiments. Other thicknesses are possible.

Figure 16:
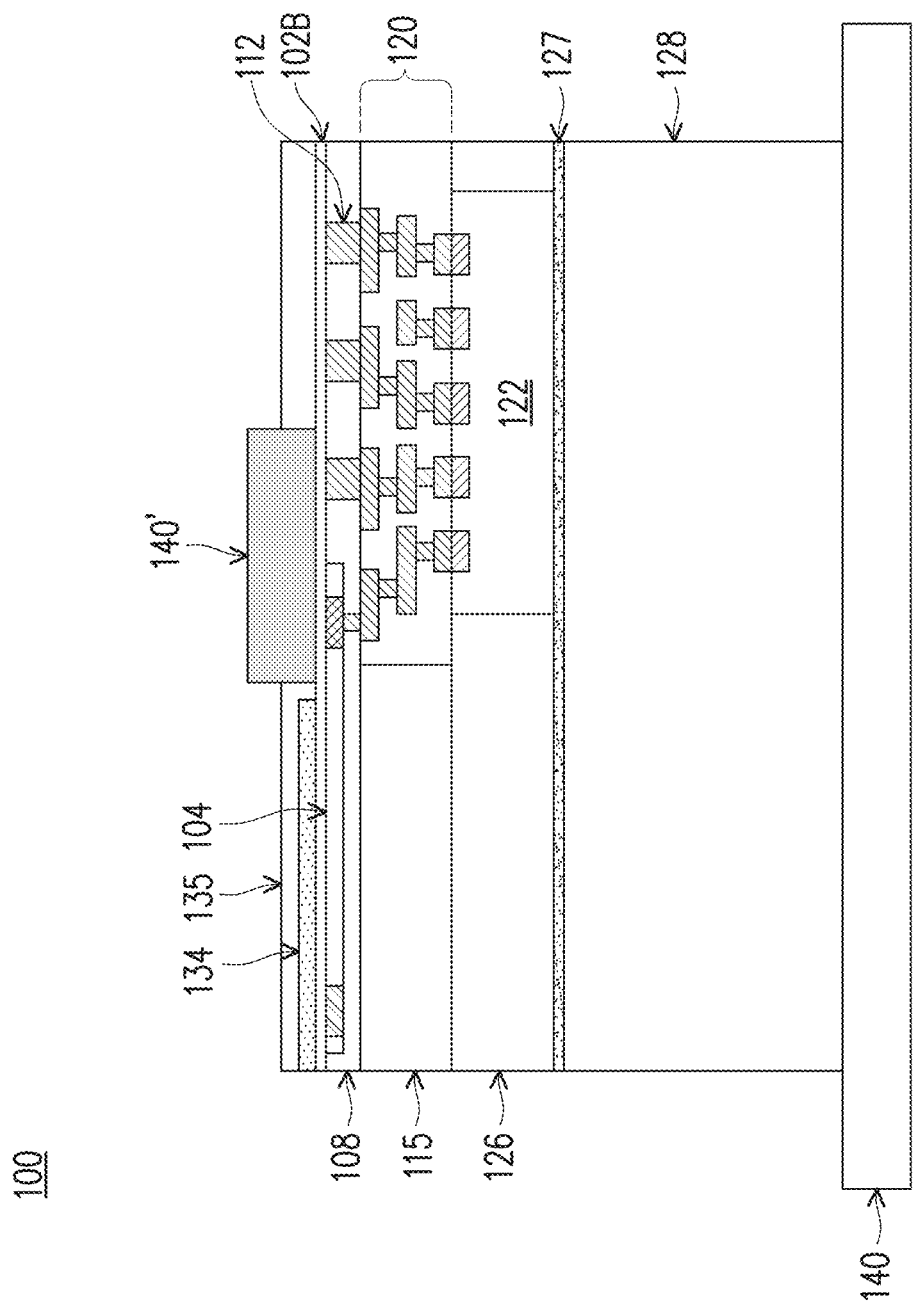
Figure 17:
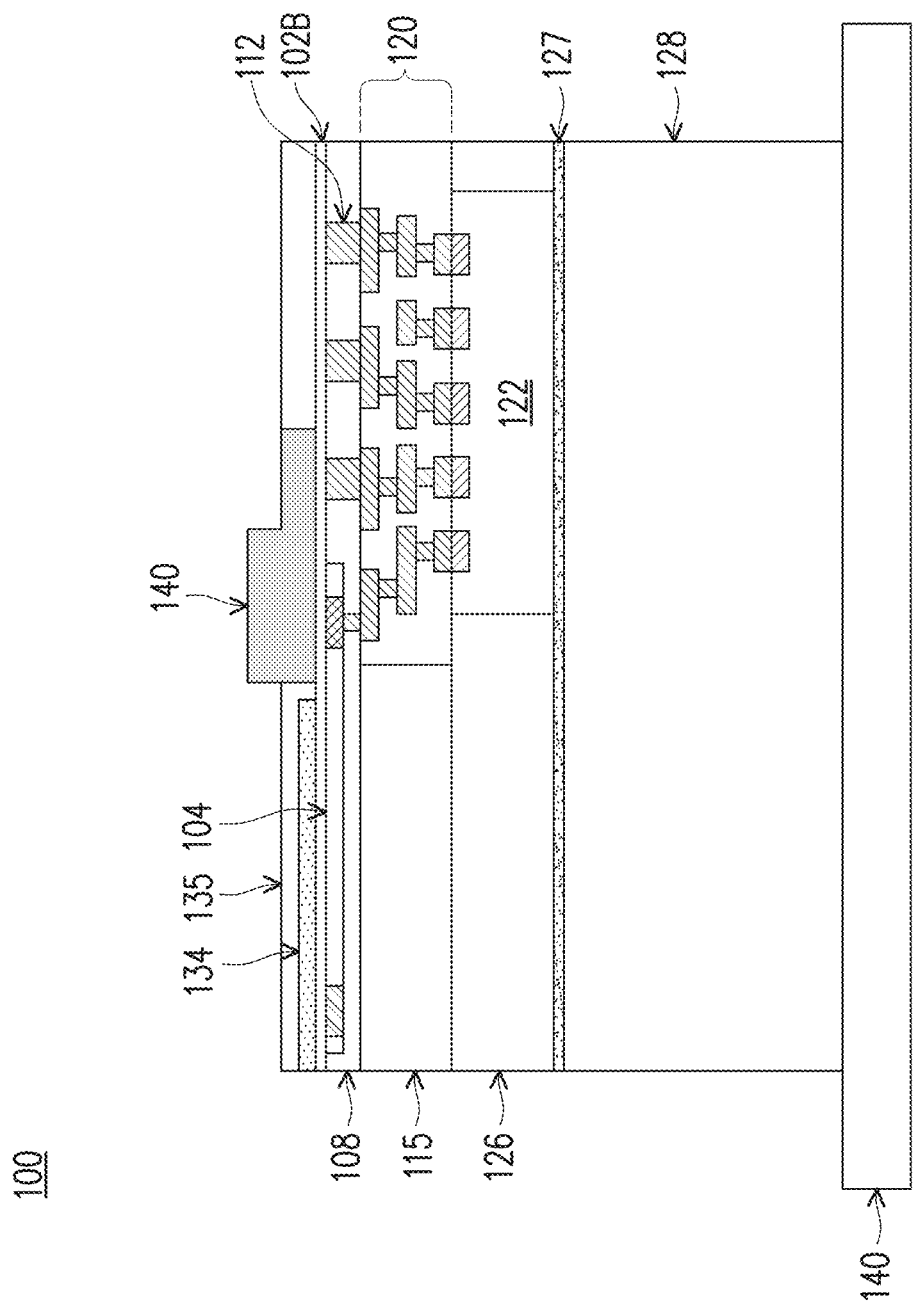

In FIGS. 16 and 17, a laser diode 140 is formed in the dielectric layer 135, in accordance with some embodiments. The laser diode 140 may be a source of light that provides optical power for the photonic package. In some embodiments, the light emitted by the laser diode 140 is coupled into the waveguide 104 and/or into an adjacent nitride waveguide 134. More than one laser diode 140 may be formed, and in other embodiments a light-emitting diode (LED) or other type of light source may be used instead of or in addition to the laser diode 140.

In FIG. 16, an opening (not shown) is formed in the dielectric layer 135 and a laser diode substrate 140' is attached to the structure within the opening. The opening in the dielectric layer 135 may be formed by suitable photolithography and etching processes. The opening may extend partially into the dielectric layer 135 or fully through the dielectric layer 135. In this manner, the laser diode substrate 140' may be attached to a surface of the dielectric layer 135 or to a surface of the oxide layer 102B exposed by the opening. In some embodiments, the laser diode substrate 140' comprises, for example, a semiconductor material such as doped or undoped silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The laser diode substrate 140' may also include various oxide layers, metallization layers, or the like. The laser diode substrate 140' may be attached to the structure within the opening using, for example, direct bonding or the like. In other embodiments, the laser diode substrate 140' is attached using an adhesive layer, an optical glue, or the like.

In FIG. 17, the laser diode substrate 140' is processed to form the laser diode 140. The processing may include suitable processing steps performed in a suitable order, such as implantation steps, etching steps, deposition steps, other types of processing steps, combinations thereof, or the like. As shown in FIG. 17, portions of the laser diode substrate 140' may be etched using, for example, a suitable photolithography and etching process. In some embodiments, etching the laser diode substrate 140' after attachment can allow for facets to be formed for the laser diode 140 that facilitate optical coupling between the laser diode 140 and a waveguide 104 or a nitride waveguide 134. By forming a laser diode 140 in this manner, the facets of a laser diode 140 may be "self-aligned" to a waveguide 103/134, which can allow for easier and more accurate alignment of the laser diode 140. In some embodiments, an implantation process may be performed to introduce dopants within the semiconductor material of the laser diode substrate 140'. For example, regions of the laser diode substrate 140' may be doped with p-type dopants, n-type dopants, or a combination. In other embodiments, the laser diode 140 is formed in advance and attached to the structure within the opening, and fewer additional processing steps are performed after attachment.

Figure 18:
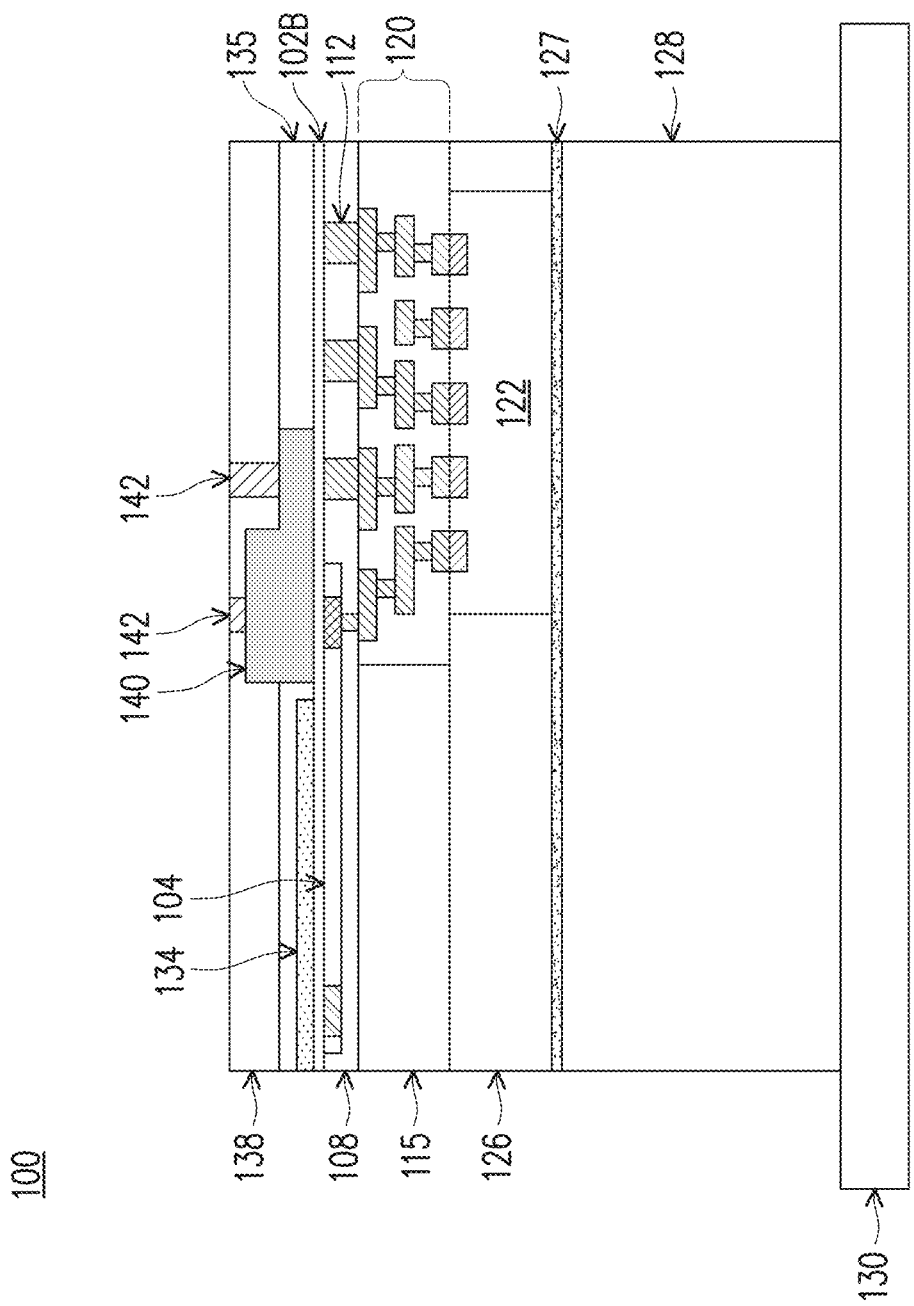

In FIG. 18, a dielectric layer 138 is formed over the laser diode 140 and contacts 142 are formed, in accordance with some embodiments. The dielectric layer 138 may comprise one or more materials similar to those described above for the dielectric layer 115, the dielectric layer 135, or another dielectric layer described herein. For example, the dielectric layer 138 may comprise a silicon oxide or the like. The dielectric layer 138 may be formed using a technique similar to those described above for the dielectric layer 115 or the dielectric layer 135, or may be formed using a different technique. For example, the dielectric layer 138 may be formed using CVD, PVD, spin-on, or the like, though another technique may be used. In some embodiments, a planarization process (e.g., a CMP or grinding process) is used to remove excess material of the dielectric layer 138. After planarization, the dielectric layer 138 may have a thickness between about 0.5 µm and about 1.5 µm, in some embodiments. Other thicknesses are possible.

Still referring to FIG. 18, contacts 142 to the laser diode 140 are formed in the dielectric layer 138, in accordance with some embodiments. In some embodiments, the contacts 142 extend through the dielectric layer 138 and are electrically connected to the laser diode 140. The contacts 142 allow electrical power or electrical signals to be transmitted to the laser diode 140. The contacts 142 may be electrically connected to subsequently formed conductive features such as redistribution layers (e.g., the redistribution layers 144 in FIG. 22), through vias (e.g., the through vias 152 in FIG. 22).

In some embodiments, the contacts 142 are formed by a damascene process, e.g., single damascene, dual damascene, or the like. The contacts 142 may be formed, for example, by forming openings extending through the dielectric layer 138. The openings may be formed using acceptable photolithography and etching techniques, such as by forming and patterning a photoresist and then performing an etching process using the patterned photoresist as an etching mask. The etching process may include, for example, a dry etching process and/or a wet etching process. A conductive material may then be formed in the openings, thereby forming contacts 142, in accordance with some embodiments. In some embodiments, a liner (not shown), such as a diffusion barrier layer, an adhesion layer, or the like, may be formed in the openings from TaN, Ta, TiN, Ti, CoW, or the like, and may be formed using suitable a deposition process such as ALD or the like. The conductive material of the contacts 142 may be formed in the openings using, for example, a plating process or another suitable process. The conductive material may include, for example, a metal or a metal alloy such as copper, silver, gold, tungsten, cobalt, aluminum, or alloys thereof. A planarization process (e.g., a CMP process or a grinding process) may be performed to remove excess conductive material along the top surface of the dielectric layer 138, such that top surfaces of the contacts 142 and the dielectric layer 138 are level. The contacts 142 may be formed using other techniques or materials in other embodiments, or a different number of contacts 142 may be formed than shown in FIG. 18.

Figure 19:
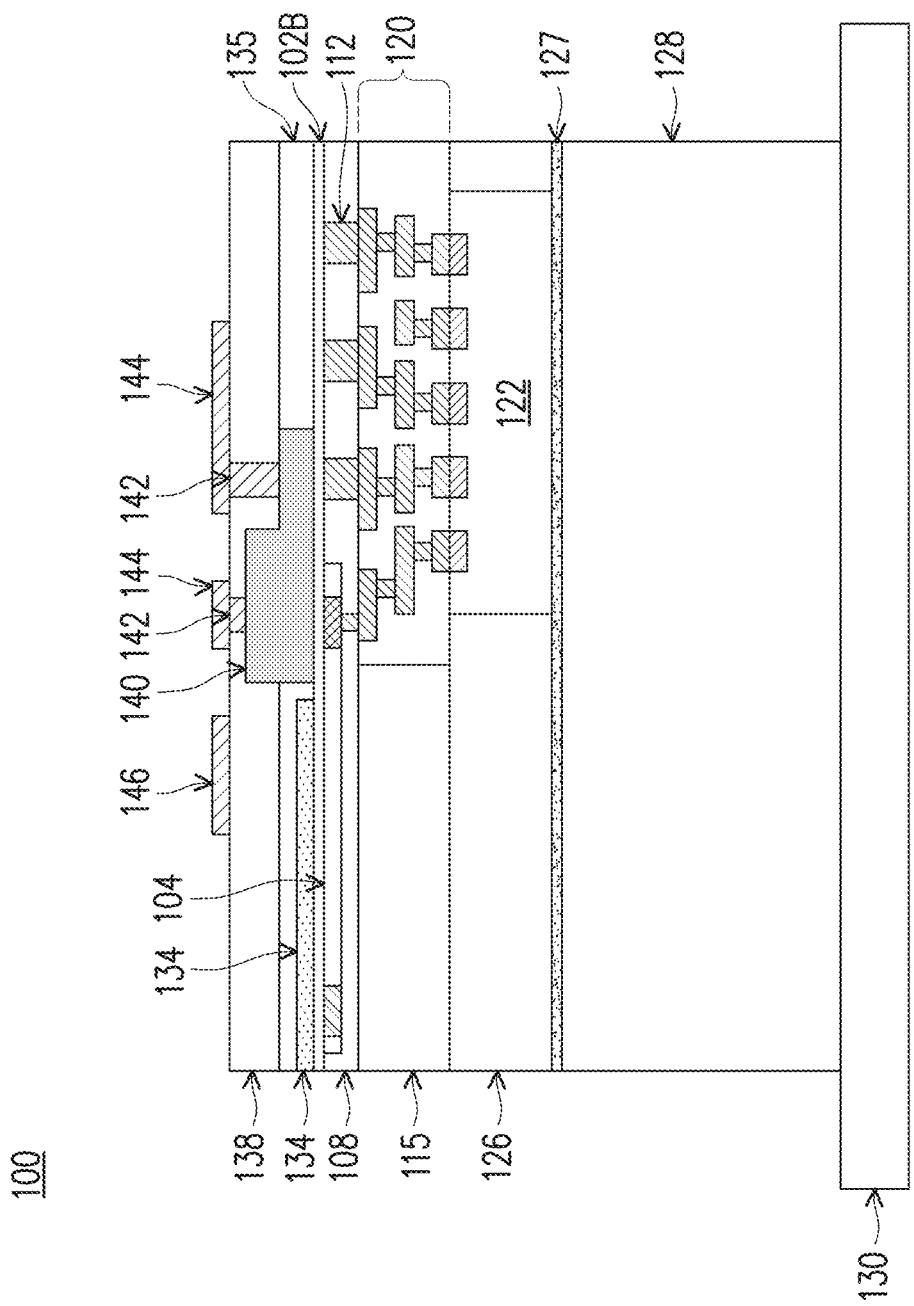

Turning to FIG. 19, conductive lines 144 and metal heaters 146 may be formed on the dielectric layer 138, in accordance with some embodiments. The conductive lines 144 may include electrical routing and/or vias, and may be considered a redistribution layer or a metallization pattern in some cases. As shown in FIG. 19, the conductive lines 144 may be formed over one or more of the contacts 142 to make electrical connection to the contacts 142. The metal heaters 146 may be formed using the same process steps (e.g., simultaneously) or using different process steps as the conductive lines 144. The metal heaters 146 are, for example, resistive heaters that can be controlled to provide heat to the structure. In some cases, heating waveguides (e.g., the waveguides 104) can stabilize the optical performance of the waveguides during operation. Additionally, by forming the metal heaters 146 on the opposite side of the waveguides 104 as the redistribution structure 120, the distance between the metal heaters and the redistribution structure 120 is increased, which can reduce deterioration or increased resistance of the redistribution structure 120 due to heating.

As an example to form the conductive lines 144 and/or the metal heaters 146, a seed layer is formed over the dielectric layer 138 and the contacts 142. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the conductive lines 144 and/or the metal heaters 146. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive lines 144 and/or the metal heaters 146. In some embodiments, the conductive lines 144 and/or the metal heaters 146 may have a thickness between about 0.5 μm and about 1.0 μm, though other thicknesses are possible. In some embodiments, the conductive lines 144 and the metal heaters 146 may be formed using different materials, having different thicknesses, and/or using different process steps.

Figure 20:
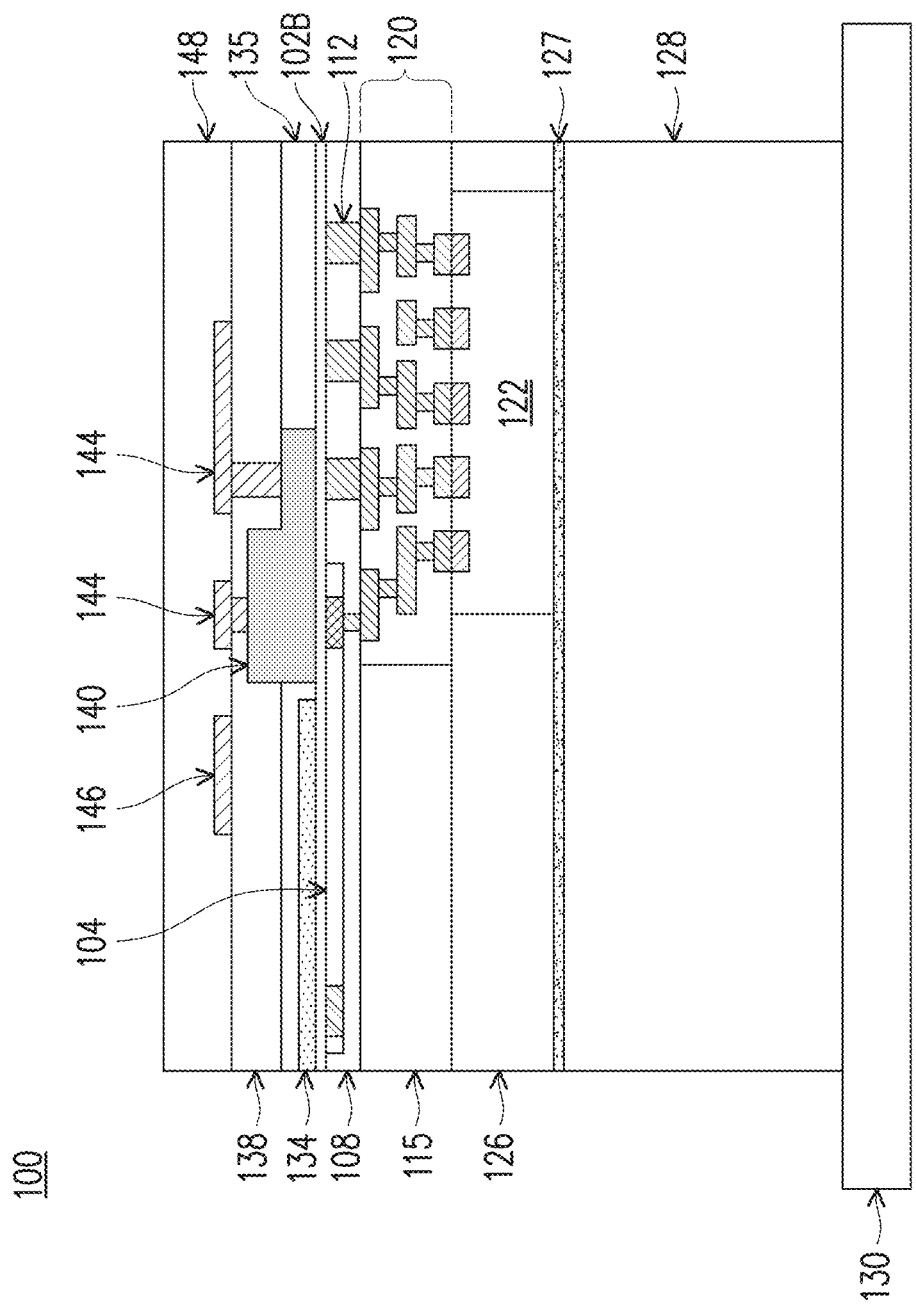

In FIG. 20, a dielectric layer 148 is formed over the conductive lines 144 and the metal heaters 146, in accordance with some embodiments. The dielectric layer 148 may comprise one or more materials similar to those described above for the dielectric layer 135, the dielectric layer 138, or another dielectric layer described herein. For example, the dielectric layer 148 may comprise a silicon oxide or the like. The dielectric layer 148 may be formed using a technique similar to those described above for other dielectric layers, such as the dielectric layer 135, or may be formed using a different technique. For example, the dielectric layer 148 may be formed using CVD, PVD, spin-on or the like, though another technique may be used. In some embodiments, a planarization process (e.g., a CMP or grinding process) is used to remove excess material of the dielectric layer 148. After planarization, the dielectric layer 148 may have a thickness between about 0.5 μm and about 1 μm, in some embodiments. Other thicknesses are possible.

Figure 21:
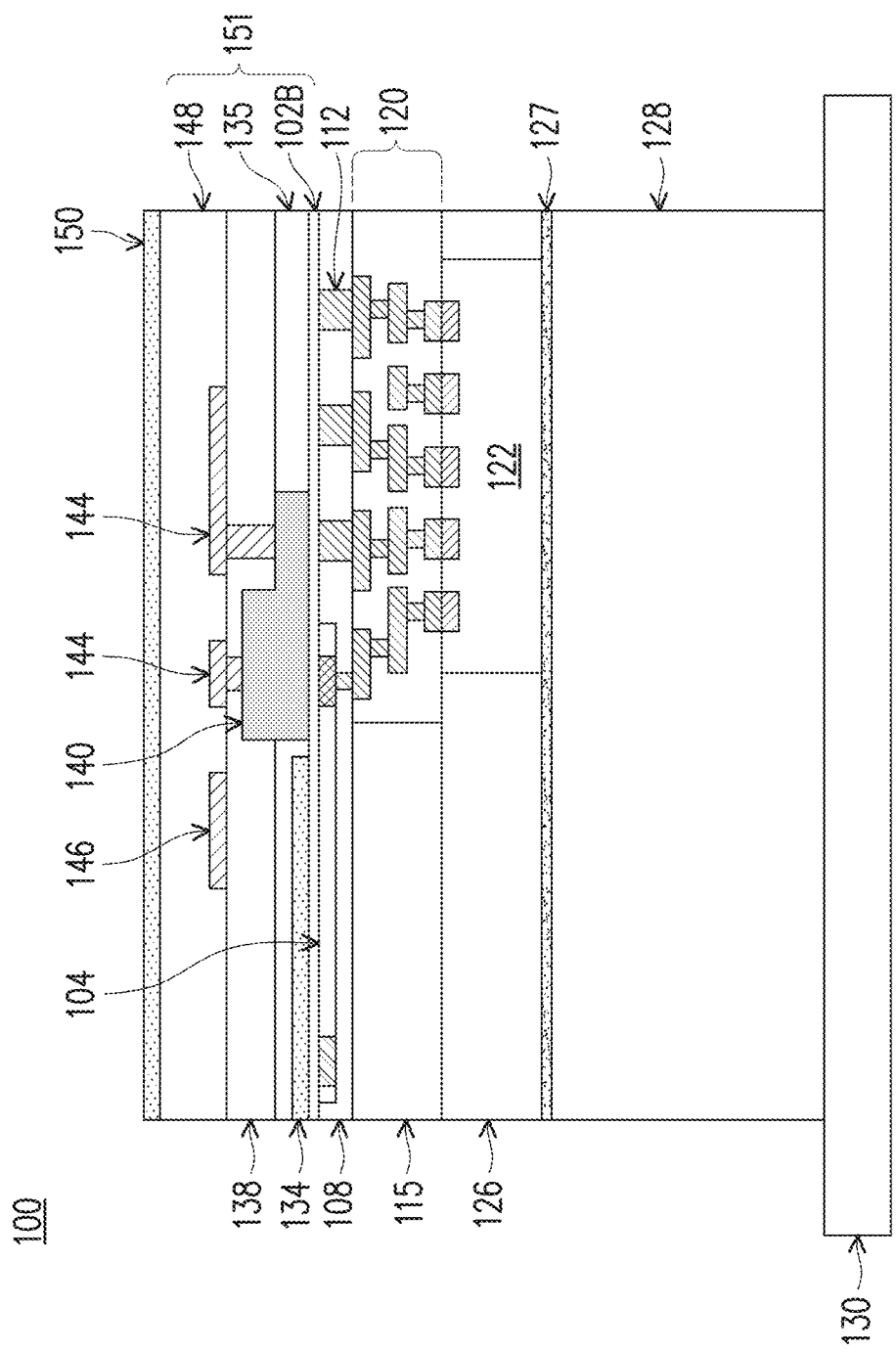

In FIG. 21, an optional passivation layer 150 is formed over the dielectric layer 148, in accordance with some embodiments. The passivation layer 150 may comprise, for example, a polymer such as PBO, polyimide, BCB, or the like; a nitride such as silicon nitride or the like; an oxide such as silicon oxide, PSG, BSG, BPSG, or the like; an encapsulant, molding compound, or the like; the like, or a combination thereof. The passivation layer 150 may be formed, for example, by spin coating, lamination, CVD, PVD, ALD, or the like. The passivation layer 150 may have a thickness between about 0.3 μm and about 1 μm, in some embodiments. Other thicknesses are possible. The layers formed on the oxide layer 102B (e.g., the passivation layer 150, the dielectric layer 148, the dielectric layer 138, the dielectric layer 135, or other layers) and the structures formed therein (e.g., the nitride waveguides 134, the laser diode 140, the conductive lines 144, the metal heaters 146, or other structures) may be collectively referred to herein as the hybrid interconnect structure 151.

Figure 22:
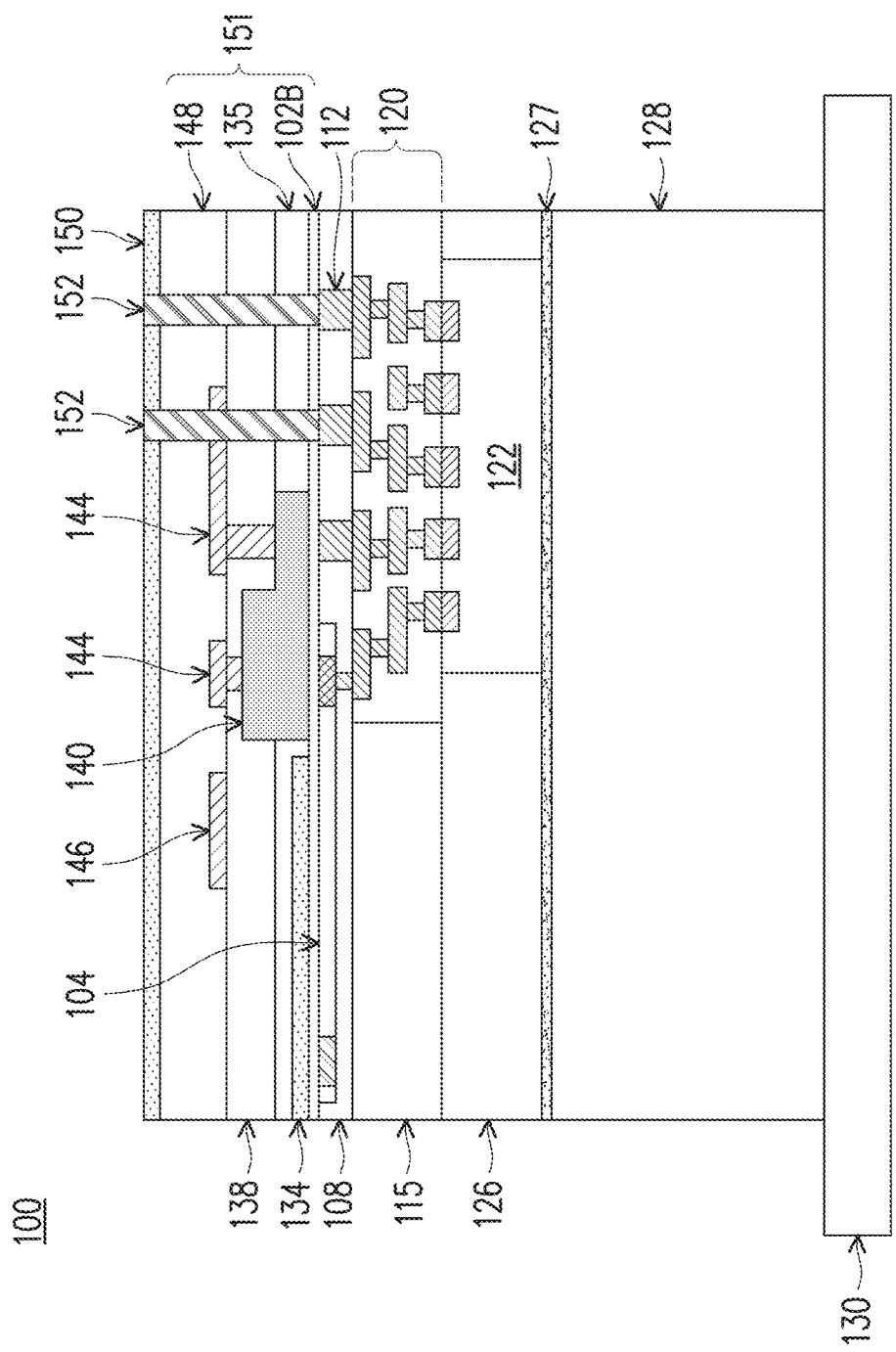

In FIG. 22, through vias 152 are formed extending through the hybrid interconnect structure 151, in accordance with some embodiments. The through vias 152 may extend through the hybrid interconnect structure 151 and the oxide layer 102B to make electrical connections to the vias 112. In some embodiments, the through vias 152 make electrical connections to structures within the hybrid interconnect structure 151 such as the conductive lines 144, and/or the metal heaters 146. The through vias 152 may, for example, provide power or transmit electrical signals to the redistribution structure 120 or the electronic die 122. In an embodiment, the through vias 152 may be formed by initially forming through via openings (not shown in the figures) through the hybrid interconnect structure 151. The through via openings may be formed by applying and patterning a photoresist (not shown) to expose regions of the hybrid interconnect structure 151 (e.g., regions of the passivation layer 150), and then etching the exposed portions to the desired depth. For example, the etching may expose surfaces of vias 112. In some embodiments, one or more openings may expose surfaces of conductive lines 144 and/or metal heaters 146, or may extend through conductive lines 144 and/or metal heaters 146.

Once the through via openings have been formed, the through via openings may be lined with a liner (not illustrated). The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used. Once the liner has been formed along the sidewalls and bottom of the through via openings, a barrier layer (also not independently illustrated) may be formed and the remainder of the through via openings may be filled with conductive material, forming the through vias 152. The conductive material may comprise copper, although other suitable materials such as aluminum, alloys, doped polysilicon, combinations thereof, and the like, may alternatively be utilized. The conductive material may be formed by electroplating copper onto a seed layer (not shown), filling and overfilling the through via openings. Once the through via openings have been filled, excess liner, barrier layer, seed layer, and conductive material outside of the through via openings may be removed using, for example, a CMP process, a grinding process, or the like. This is an example, and other techniques may be used to form the through vias 152 in other embodiments.

Figure 23:
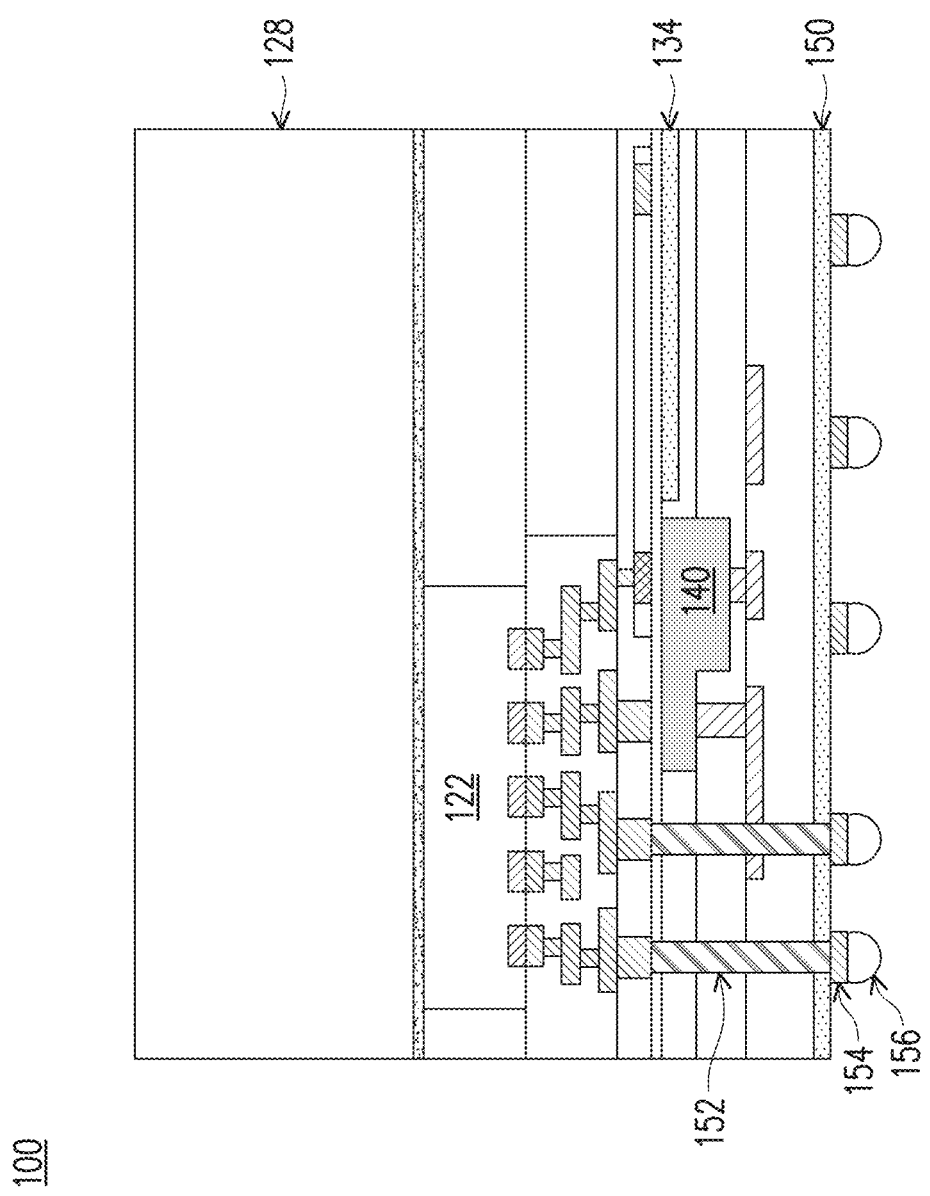

In FIG. 23, a de-bonding is performed to detach (or "de-bond") the carrier 130 from the structure, forming a photonic package 100, in accordance with some embodiments. For example, the de-bonding may include projecting a light such as a laser light or an UV light on the release layer (if present) so that the release layer decomposes under the heat of the light and the carrier 130 can be removed. In some embodiments, multiple photonic packages 100 may be formed on a single substrate 102 and singulated to form individual photonic packages 100, such as the individual photonic package 100 shown in FIG. 23. The singulation may be performed, for example, before or after the debonding.

In FIG. 23, under-bump metallizations (UBMs) 154 and conductive connectors 156 are formed for external connection to the through vias 152, in accordance with some embodiments. The UBMs 154 have bump portions on and extending along the major surface of the passivation layer 150 and are electrically coupled to the through vias 152. The UBMs 154 may be formed of one or more conductive materials using a suitable process, such as plating. In some embodiments, the UBMs 154 are not formed.

The conductive connectors 156 are then formed on the UBMs 154, in accordance with some embodiments. The conductive connectors 156 may be, for example, ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 156 may include a conductive material such as solder, copper, aluminum, gold, nickel, silver, palladium, tin, the like, or a combination thereof. In some embodiments, the conductive connectors 156 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 156 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 24:
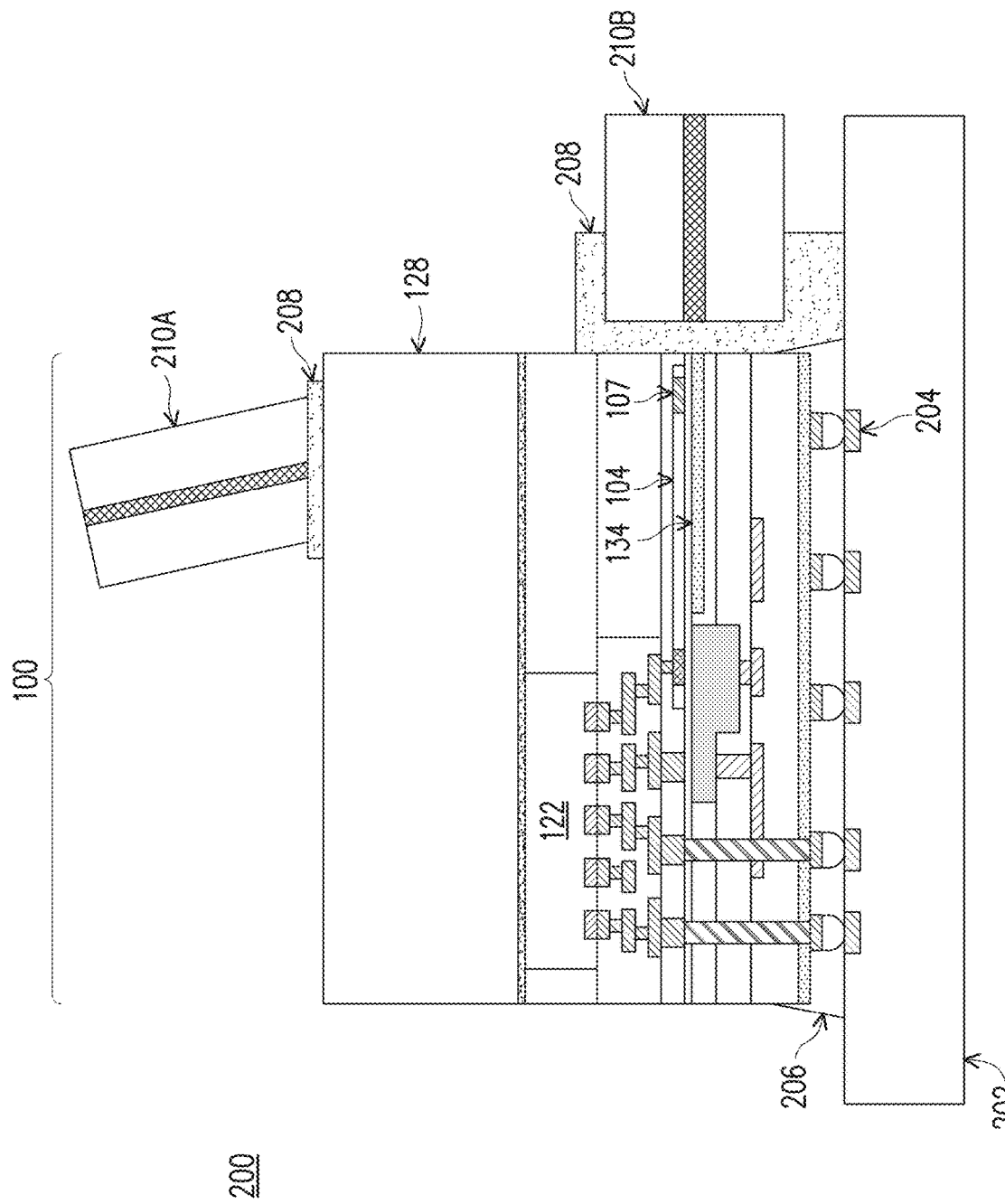
FIG. 24 illustrates a cross-sectional view of a photonic system, in accordance with some embodiments.

FIG. 24 illustrates the formation of a photonic system 200, in accordance with some embodiments. In FIG. 24, the photonic package 100 is attached to an interconnect substrate 202, in accordance with some embodiments. The interconnect substrate 202 may be for example, a glass substrate, a ceramic substrate, a dielectric substrate, an organic substrate (e.g., an organic core), a semiconductor substrate (e.g., a semiconductor wafer), the like, or a combination thereof. In some embodiments, the interconnect substrate 202 includes conductive pads 204 and conductive routing (e.g., conductive lines, vias, redistribution structures, or the like). The interconnect substrate 202 may include passive or active devices, in some embodiments. In some embodiments, the interconnect substrate 202 may be another type of structure, such as an integrated fan-out structure, a redistribution structure, or the like.

The conductive connectors 156 of the photonic package 100 may be bonded to the conductive pads 204 of the interconnect substrate 202, forming electrical connections between the photonic package 100 and the interconnect substrate 202. For example, the conductive connectors 156 of the photonic package 100 may be placed in physical contact with the conductive pads 204, and then a reflow process may be performed to bond solder material of the conductive connectors 156 to the conductive pads 204. In some embodiments, an underfill 206 may be formed between the photonic package 100 and the interconnect substrate 202.

Still referring to FIG. 24, the photonic package 100 is shown coupled to optical fibers 210A-B, in accordance with some embodiments. FIG. 24 shows the photonic package 100 coupled to a vertically-mounted optical fiber 210A and an edge-mounted optical fiber 210B. In other embodiments, only vertically-mounted optical fibers 210A or only edge-mounted optical fibers 210B are coupled to the photonic package 100, or another number of vertically-mounted optical fibers 210A or edge-mounted optical fibers 210B are coupled to the photonic package 100. The optical fibers 210 may be mounted to the photonic package 100 using an optical glue 208 or the like. In some embodiments, alignment marks for the aligning of a vertically-mounted optical fiber 210A may be formed in the photonic package 100, for example, in the support 128, dielectric material 126, dielectric layer 115, or in another layer.

In some embodiments, the vertically-mounted optical fiber 210A may be configured to optically couple to a grating coupler within the photonic package 100, such as the grating coupler 107. The vertically-mounted optical fiber 210A may be mounted at an angle with respect to the vertical axis or may be laterally offset from the grating coupler 107. The optical signals and/or optical power transmitted between the vertically-mounted optical fiber 210A and the grating coupler 107 are transmitted through the dielectric layer 108, the dielectric layers 115, the dielectric material 126, and the support 128 formed over the grating coupler 107. Optical signals may be transmitted from the optical fiber 210A to the grating coupler 107 and into the waveguides 104, wherein the optical signals may be detected by a photonic component 106 comprising a photodetector and transmitted as electrical signals into the electronic die 122. Optical signals generated within the waveguides 104 by a photonic component 106 comprising a modulator may similarly be transmitted from the grating coupler 107 to the vertically mounted optical fiber 210A. Mounting the optical fiber 210A in a vertical orientation may allow for improved optical coupling, reduced processing cost, or greater design flexibility of a photonic package 100 or a photonic system 200.

In some embodiments, the edge-mounted optical fiber 210B may be configured to optically couple to an edge coupler within the photonic package 100, such an edge coupler formed in a waveguide 104 or in a nitride waveguide 134. An edge coupler may be located near an edge or sidewall of the photonic package 100. The edge-mounted optical fiber 210B may be mounted at an angle with respect to the horizontal axis or may be vertically offset from the edge coupler. The optical signals and/or optical power transmitted between the edge-mounted optical fiber 210B and the edge coupler may be transmitted through a dielectric layer (e.g., dielectric layer 108 or dielectric layer 138). For example, optical signals may be transmitted from the edge-mounted optical fiber 210B to the edge coupler and into the waveguides 104 or into the nitride waveguides 134. In some embodiments, a single optical fiber 210B may be coupled into more than one waveguide 104 or more than one nitride waveguide 134. In this manner, a photonic package 100 or a photonic system 200 as described herein may be coupled to optical fibers 210 in different configurations, allowing for greater flexibility of design.

Figure 25:
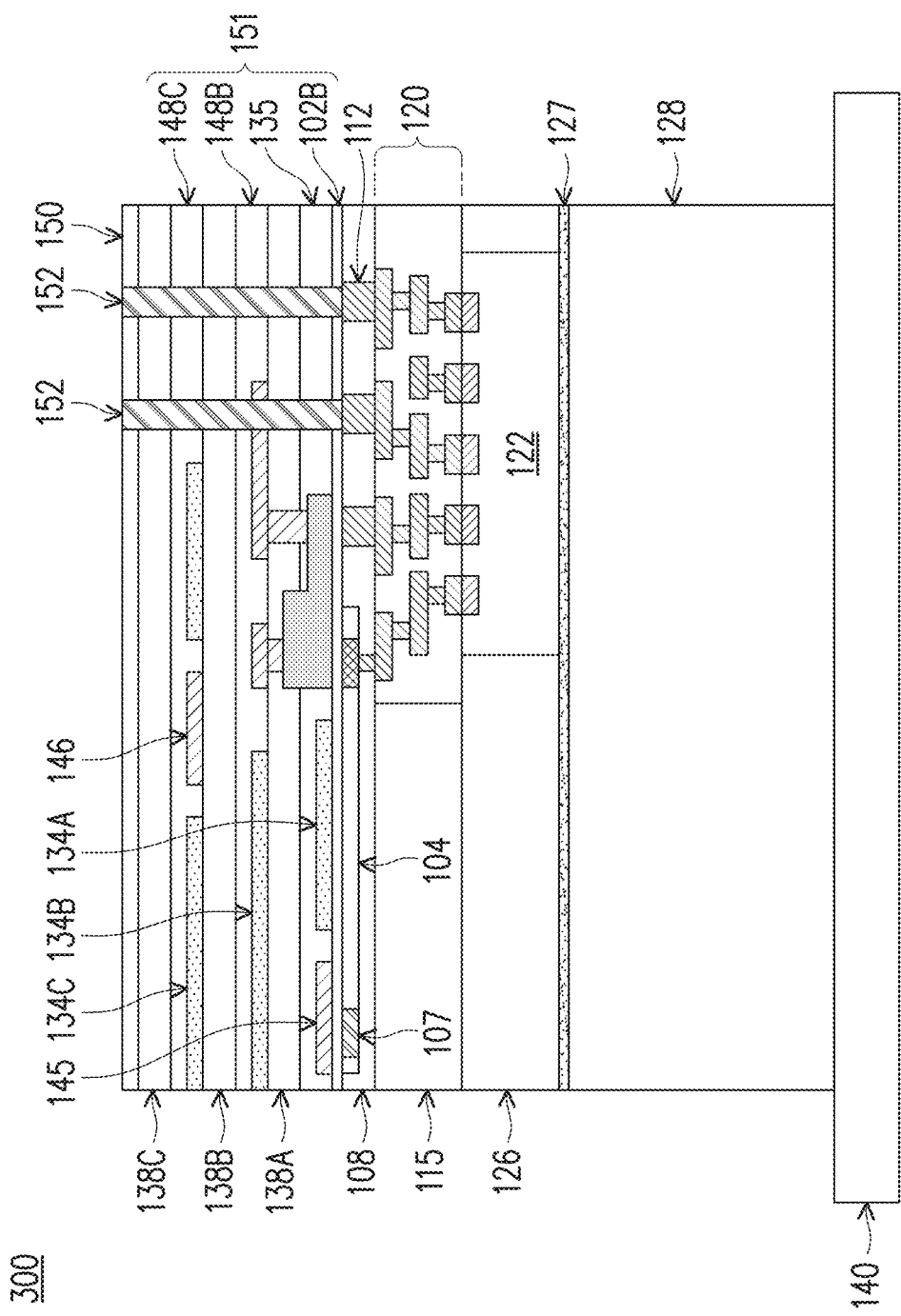
FIG. 25 illustrates a cross-sectional view of an intermediate step of forming an photonic package, in accordance with some embodiments.
Figure 26:
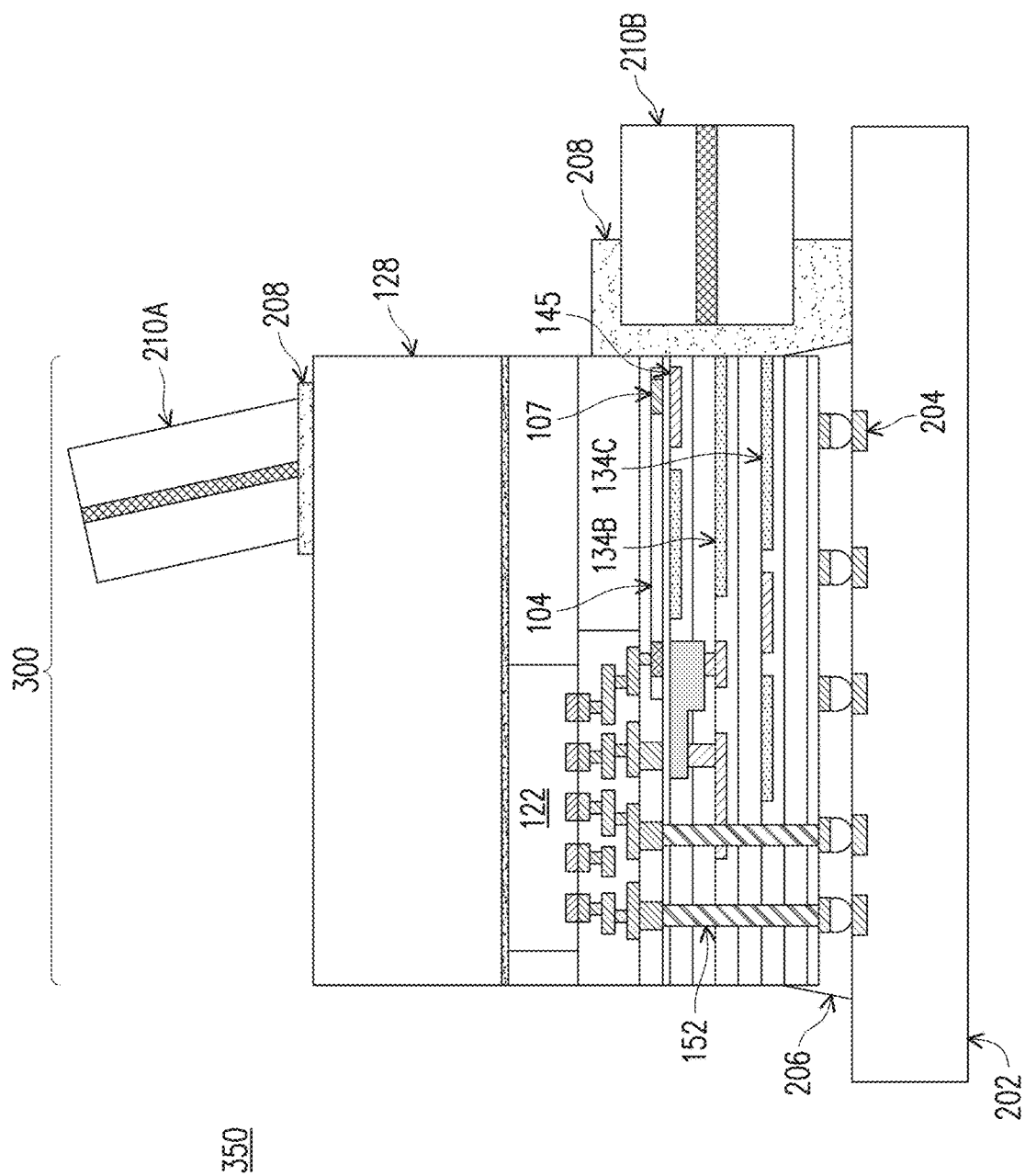
FIG. 26 illustrates a cross-sectional view of a photonic system, in accordance with some embodiments.

FIGS. 25 and 26 illustrate a photonic package 300 and a photonic system 350, in accordance with some embodiments. The photonic package 300 is similar to the photonic package 100 shown in FIG. 24, except that the photonic package 300 includes a hybrid interconnect structure 151 that comprises multiple nitride waveguides 134A-C and/or multiple conductive lines 144 that may be formed on multiple layers of the hybrid interconnect structure 151. The multiple nitride waveguides 134A-C may be similar to the nitride waveguides 134 of FIG. 24, and may be formed in a similar manner. The dielectric layers 138A-C may be similar to the dielectric layer 138 of FIG. 24, and the dielectric layers 148A-C may be similar to the dielectric layer 148 of FIG. 24. The nitride waveguides 134A-C may be optically coupled such that optical signals may be transmitted between the nitride waveguides 134A-C. For example, nitride waveguides 134A-C on different layers may partially overlap and/or be shaped such that optical signals are transmitted between the different nitride waveguides 134A-C. In this manner, the multiple nitride waveguides 134A-C may form an optical network that communicates signals within the photonic package 300. In some cases, the use of an optical network within a photonic package may allow for higher bandwidth and lower intercommunication latency between components of the photonic package, such as between electronic dies or the like. In some cases, the photonic package 300 may be considered a network-on-chip (NoC) or a photonic-network-on-chip (PNoC) structure, or the nitride waveguides 134A-C may be considered an optical routing structure.

As an example of formation, the nitride waveguides 134B may be formed by first forming the dielectric layer 138A over the dielectric layer 135. A dielectric layer 138A may be planarized, in some embodiments. The nitride waveguides 134B may then be formed over the dielectric layer 138A. For example, a layer of silicon nitride may be deposited and patterned in a manner similar to that described for FIGS. 13-14. In some embodiments, other features such as contacts 142, conductive lines 144, and/or metal heaters 146 may also be formed on or within the dielectric layer 138A using techniques similar to those previously described. The dielectric layer 148B may then be formed over the nitride waveguides 134B and the dielectric layer 138A. The nitride waveguides 134C may then be formed in a similar manner as the nitride waveguides 134B. Additional nitride waveguides may be formed over the nitride waveguides 134C, for example, by repeating steps similar to those for forming the nitride waveguides 134B-C.

More or fewer nitride waveguides 134, conductive lines 144, dielectric layers, or other features may be formed than shown in FIGS. 25-26, and the features may be formed in a different configuration than shown in FIGS. 25-26. For example, the conductive lines 144, metal heaters 146, or laser diode 140 may be formed on different layers of the hybrid interconnect structure 151 than shown. In some embodiments, an optional reflector 145 is formed over a grating coupler 107. The reflector 145 can be configured to reflect the light from a photonic component such as, for example, a vertically mounted optical fiber 210A, and can allow for more efficient coupling between a grating coupler 107 and the photonic component. The reflector 145 may be formed from one or more dielectric materials, metal materials, or the like, which may be deposited using suitable deposition processes. After depositing the material of the reflector 145, the reflector 145 may be formed using suitable techniques, such as using photolithographic patterning and etching techniques. Other techniques of forming a reflector 145 are possible.

The photonic system 350 shown in FIG. 26 is similar to the photonic system 200 shown in FIG. 24, and includes the photonic package 300 shown in FIG. 25. For example, the photonic system 350 includes an interconnect substrate 202 connected to through vias 152 of the hybrid interconnect structure 151. The photonic system 350 includes a vertically-mounted optical fiber 210A that is optically coupled to the grating coupler 107 (using the optional reflector 145) and an edge-mounted optical fiber 210B that is optically coupled to the nitride waveguides 134B-C. The edge-mounted optical fiber 210B is shown in FIG. 26 as optically coupled to two nitride waveguides (e.g., nitride waveguides 134B-C), but in other embodiments an edge-mounted optical fiber 210B may be optically coupled to one nitride waveguide 134 or more than two nitride waveguides 134. In this manner, a photonic system 350 may include photonic packages 300 configured to be coupled to edge mounted optical fibers 210, vertically mounted optical fibers 210, or a combination thereof.

Figure 27:
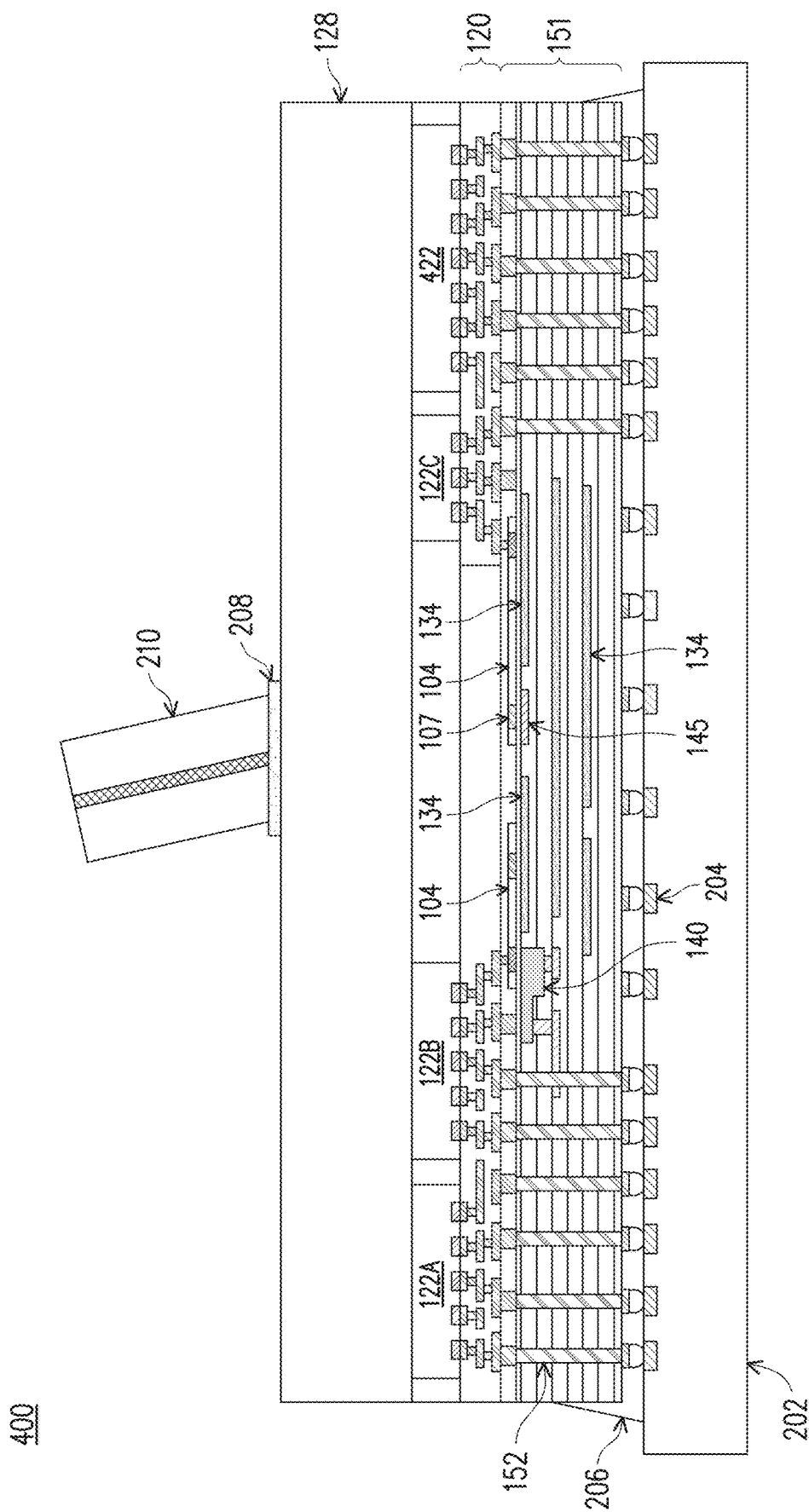
FIG. 27 illustrates a cross-sectional view of a photonic system, in accordance with some embodiments.

FIG. 27 shows a photonic system 400 including multiple electronic dies 122A-C and/or one or more semiconductor devices 422, in accordance with some embodiments. The photonic system 400 shown in FIG. 27 is similar to the photonic system 350 shown in FIG. 26, except that the photonic system 400 includes multiple electronic dies 122A-C and/or semiconductor devices 422. The photonic system 400 includes a hybrid interconnect structure 151 comprising multiple waveguides 104 and multiple nitride waveguides 134 that allows for communication between the electronic dies 122A-C and semiconductor devices 422 using optical signals. The use of an optical network in this manner can allow for improved communication speed within the photonic system 400, which can improve efficiency and high-speed performance. The photonic system 400 may include an interconnect substrate 202 connected to through vias 152 of the hybrid interconnect structure 151, as shown in FIG. 27. The photonic system 400 may include a different number of components than shown, or a different configuration of components than shown. For example, more than one optical fiber 210 (vertically-mounted and/or edge-mounted) may be coupled to the photonic system 400.

The photonic system 400 shown in FIG. 27 includes three electronic dies 122A-C and one semiconductor device 422, though in other embodiments a photonic system 400 may include more or fewer dies or devices and/or different types of dies or devices. The electronic dies 122A-C may be similar to the electronic dies 122 described previously, or may be different than the electronic dies 122 described previously. In some embodiments, the semiconductor device 422 may comprise, for example, a processing die, a central processing unit (CPU), a graphics processing unit (GPU), an application-specific integrated circuit (ASIC), a high performance computing (HPC) die, the like, or a combination thereof. In some embodiments, the semiconductor device 422 may comprise, for example, a memory die, a high-bandwidth memory (HBM) device, a volatile memory such as dynamic random-access memory (DRAM), static random-access memory (SRAM), another type of memory, or the like. In some embodiments, processing and memory functionality may be integrated within the same semiconductor device 422 or be separate semiconductor devices 422. The semiconductor devices 422 may include one or more semiconductor devices, chips, dies, system-on-chip (SoC) devices, system-on-integrated-circuit (SoIC) devices, the like, or a combination thereof. The electronic dies 122A-C and the semiconductor device 422 may have a different arrangement than shown. These and other configurations are considered within the scope of the present disclosure.

Figure 28:
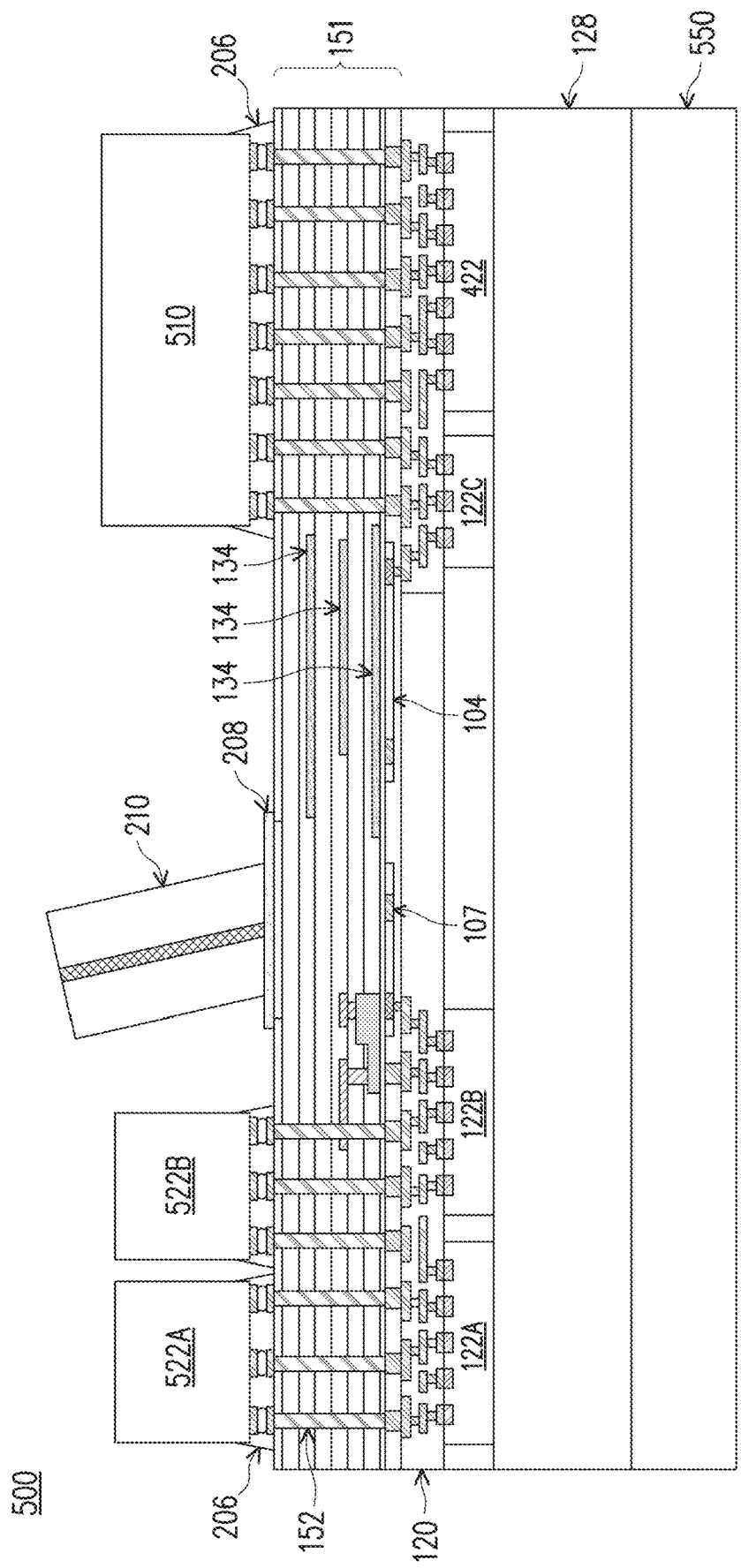
FIG. 28 illustrates a cross-sectional view of a photonic system, in accordance with some embodiments.

FIG. 28 shows a photonic system 500 including multiple electronic dies 122A-C, semiconductor devices 422, and backside devices 522A-B, in accordance with some embodiments. The photonic system 500 shown in FIG. 28 is similar to the photonic system 400 shown in FIG. 27, except that the photonic system 500 includes backside devices 522A-B and a connector module 510 connected to the through vias 152. The photonic system 500 may also include an optional support 128, and an optional thermal module 550 attached to the support 128.

The photonic system 500 includes a hybrid interconnect structure 151 comprising multiple waveguides 104 and multiple nitride waveguides 134 that allows for communication between the electronic dies 122A-C and semiconductor devices 422 using optical signals. In some embodiments, the optical network formed by the waveguides 104 and the nitride waveguides 134 may also facilitate communication with the backside devices 522A-B and/or the connector module 510. In some embodiments, a vertically-mounted optical fiber 210 may be attached to the hybrid interconnect structure 151, and optical signals may be transmitted through the dielectric layers of the hybrid interconnect structure 151 between the vertically-mounted optical fiber 210 and a grating coupler 107. The use of an optical network in this manner can allow for improved communication speed within the photonic system 500, which can improve efficiency and high-speed performance. The photonic system 500 may include a different number of components than shown, or a different configuration of components than shown. For example, more than one optical fiber 210 (vertically-mounted and/or edge-mounted) may be coupled to the photonic system 500.

The photonic system 500 shown in FIG. 27 includes two backside dies 522A-B, though in other embodiments a photonic system 500 may include more or fewer dies or devices and/or different types of dies or devices. The electronic dies 122A-C may be similar to the electronic dies 122 described previously, or the semiconductor devices 422 may be similar to the semiconductor device 422 described previously. The backside devices 522A-B may comprise dies or device similar to those previously described for the semiconductor devices 422. For example, in some embodiments the backside devices 522A-B may be HBM devices, though other types of devices are possible.

The connector module 510 may be, for example, a connector, socket, pin connector, or the like that, for example, allows communication with the photonic system 500 using electrical signals. The connector module 510 may allow electrical power to be provided to the photonic system 500, in some embodiments. A different number or configuration of connector modules 510 than shown in FIG. 28 may be present, in other embodiments. The support 128 may be similar to the support 128 described previously for FIG. 10. The thermal module 550 may be, for example, a heat sink or structure that provides cooling or thermal dissipation for the photonic system 500.

FIGS. 29 through 39 illustrate cross-sectional views of intermediate steps during a process for forming a photonic package 600 (see FIG. 39), in accordance with some embodiments. The photonic package 600 includes multiple layers of waveguides 104 with photonic components 106, in some embodiments. Forming multiple layers of waveguides and photonic components 106 as described herein can allow the photonic components 106 to be utilized in parallel, which can improve the efficiency and computing speed of an optical computing system such as the photonic system 700 (see FIG. 40).

Figure 29:
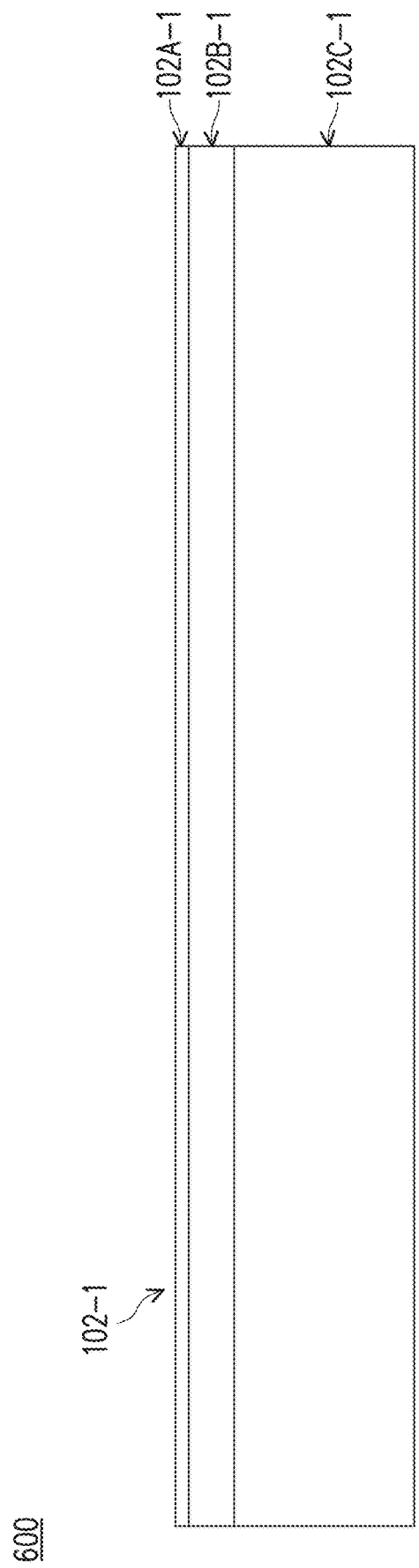
FIGS. 29 through 39 illustrate cross-sectional views of intermediate steps of forming a photonic package, in accordance with some embodiments.
Figure 30:
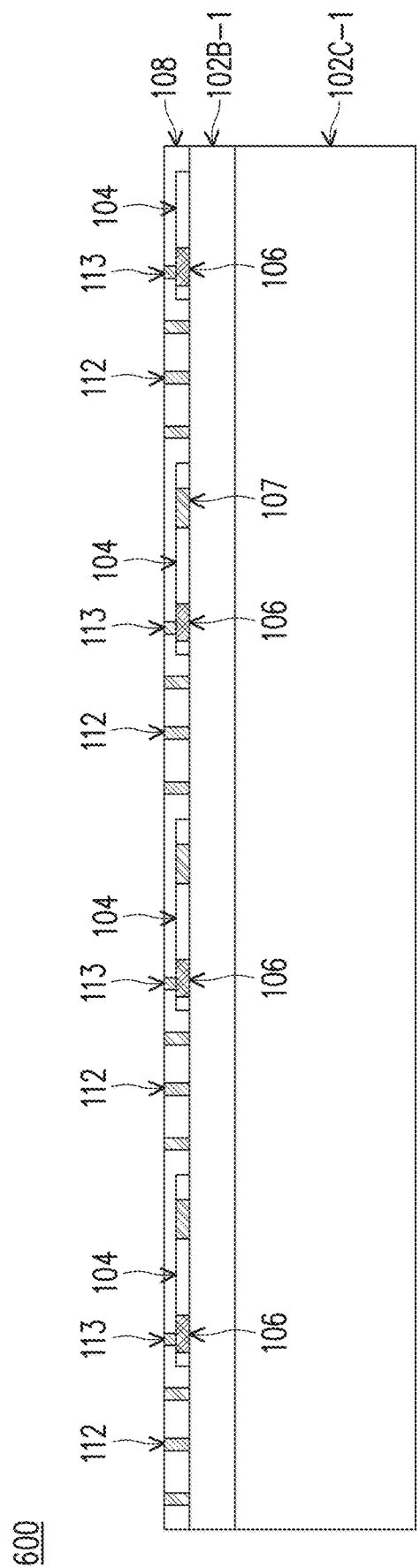

Turning to FIG. 29, a buried oxide ("BOX") substrate 102-1 is provided, in accordance with some embodiments. The BOX substrate 102-1 may be similar to the BOX substrate 102 described previously for FIG. 1. For example, the BOX substrate 102-1 includes an oxide layer 102B-1 formed over a substrate 102C-1, and a silicon layer 102A-1 formed over the oxide layer 102B-1. In FIG. 30, waveguides 104, photonic components 106, and/or grating couplers 107 are formed, in accordance with some embodiments. The waveguides 104, photonic components 106, or grating couplers 107 may be similar to those described for FIG. 3, and may be formed in a similar manner. For example, the silicon layer 102A-1 may be patterned to form the waveguides 104. The waveguides 104 may be individual separate waveguides 104 or connected as a single continuous structure. In some embodiments, one or more of the waveguides 104 form a continuous loop. The photonic components 106 and/or grating couplers 107 may be integrated with the waveguides 104, and may be formed with the silicon waveguides 104. The photonic components 106 may be optically coupled to the waveguides 104 to interact with optical signals within the waveguides 104. The photonic components 106 may include, for example, photodetectors and/or modulators.

Other configurations or arrangements of waveguides 104, the photonic components 106, or the grating couplers 107 are possible, and other types of photonic components 106 or photonic structures may be formed.

Still referring to FIG. 30, a dielectric layer 108 is formed over the waveguides 104, photonic components 106, and grating couplers 107, and then vias 112 and contacts 113 are formed in the dielectric layer 108, in accordance with some embodiments. The dielectric layer 108 may be similar to the dielectric layer 108 described for FIG. 3, and may be formed in a similar manner. The vias 112 and contacts 113 may be similar to those described for FIG. 4, and may be formed in a similar manner. For example, the vias 112 may extend through the dielectric layer 108, and the contacts 113 may be electrically connected to the photonic components 106.

Figure 31:
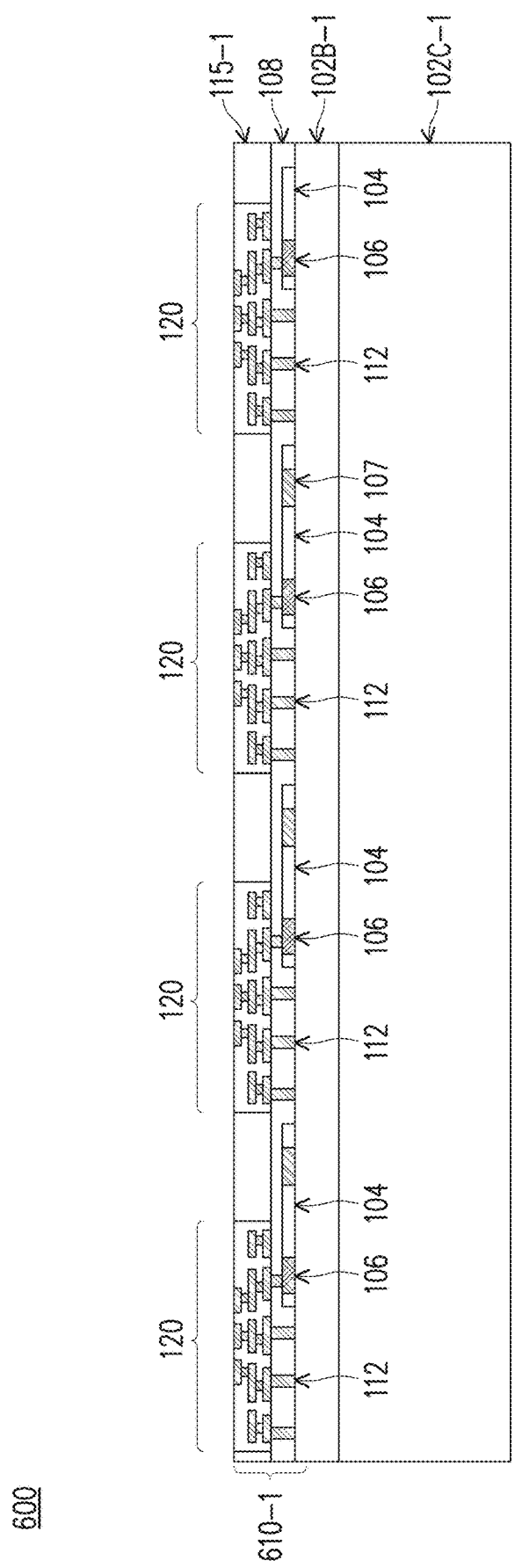

In FIG. 31, one or more redistribution structures 120 are formed, in accordance with some embodiments. The redistribution structures 120 may be similar to the redistribution structures 120 formed in FIG. 5, and may be formed in a similar manner. For example, each redistribution structure 120 may be connected to one or more vias 112 and/or contacts 113. In some embodiments, portions of the redistribution structures 120 are removed and replaced by a dielectric layer 115-1. The dielectric layer 115-1 may be similar to the dielectric layer 115 described for FIG. 6, and may be formed in a similar manner. The waveguides 104, photonic components 106, redistribution structures 120, vias 112, and other associated features may collectively be referred to as the first hybrid interconnect structure 610-1.

Figure 32:
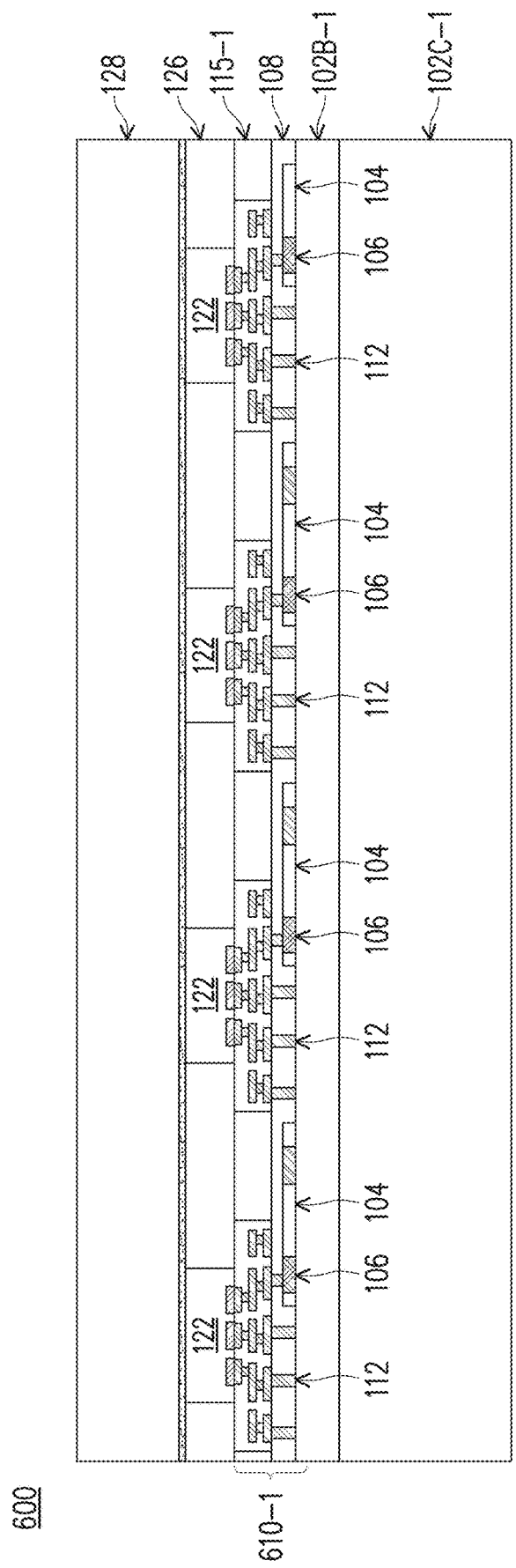

In FIG. 32, one or more electronic dies 122 are bonded to respective redistribution structures 120, in accordance with some embodiments. The electronic dies 122 may be, for example, semiconductor devices, dies, or chips that communicate with the photonic components 106 using electrical signals, such as those described previously for FIG. 8. In FIG. 32, one electronic die 122 is shown attached to each redistribution structure 120, but in other embodiments more than one electronic die 122 may be attached to a redistribution structure 120. In some embodiments, the electronic dies 122 are bonded to the redistribution structures 120 by dielectric-to-dielectric bonding and/or metal-to-metal bonding (e.g., direct bonding, fusion bonding, oxide-to-oxide bonding, hybrid bonding, or the like. During the bonding, metal bonding may also occur between the die connectors of the electronic dies 122 and the conductive pads of the redistribution structures 120. A dielectric material 126 may then be formed over the electronic dies 122 and the redistribution structures 120, in accordance with some embodiments. The dielectric material 126 may be similar to the dielectric material 126 described for FIG. 9, and may be formed in a similar manner. An optional support 128 may be attached to the structure, in accordance with some embodiments. The optional support 128 may be similar to the support 128 described previously for FIG. 10.

Figure 33:
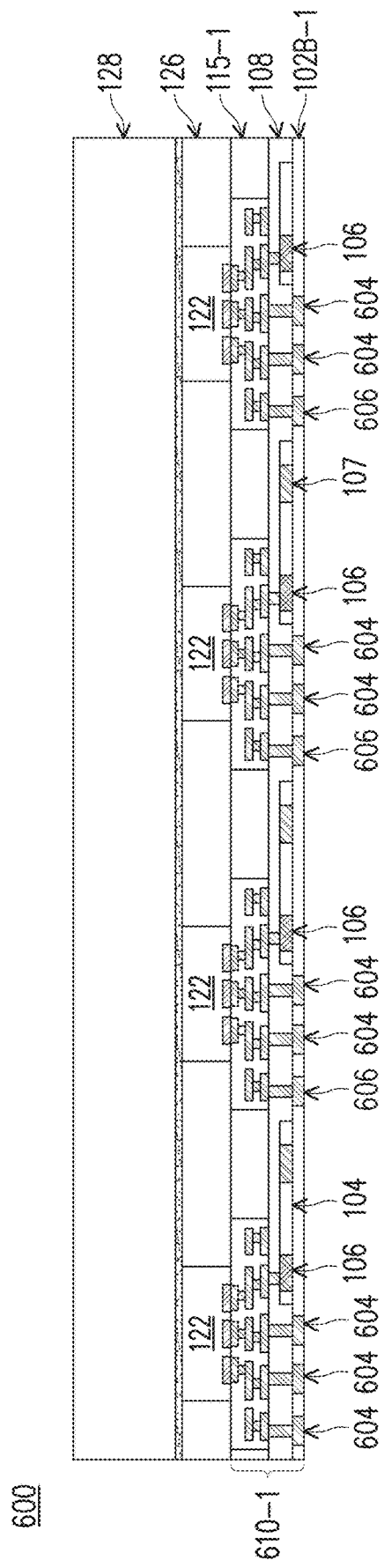

In FIG. 33, the substrate 102C-1 is removed and conductive lines 604 and contact pads 606 are formed, in accordance with some embodiments. The substrate 102C-1 may be removed using a planarization process (e.g., a CMP or grinding process), an etching process, a combination thereof, or the like. In some embodiments, the oxide layer 102B-1 is also thinned. The oxide layer 102B-1 may be thinned as part of the removal process for the substrate 102C-1, or the oxide layer 102B-1 may be thinned in a separate step. The oxide layer 102B-1 may be thinned, for example, using a planarization process, an etching process, a combination thereof, or the like. In some embodiments, after thinning, the oxide layer 102B-1 may have a thickness between about 0.3 µm and about 2 µm.

After removing the substrate 102C-1, conductive features are formed in the oxide layer 102B-1. The conductive features may include, for example, conductive lines 604 and/or contact pads 606. In some cases, the contact pads 606 are formed as part of the conductive lines 604. The conductive lines 604 and/or contact pads 606 may be electrically connected to vias 112. The conductive lines 604 may, for example, provide additional electrical routing for the photonic package 600. The contact pads 606 may provide electrical connections between the first hybrid interconnect structure 610-1 and other structures such as the second hybrid interconnect structure 610-2, described below for FIGS. 34-35. The conductive lines 604 and contact pads 606 may be formed, for example, using a damascene process, e.g., single damascene, duel damascene, or the like.

Figure 34:
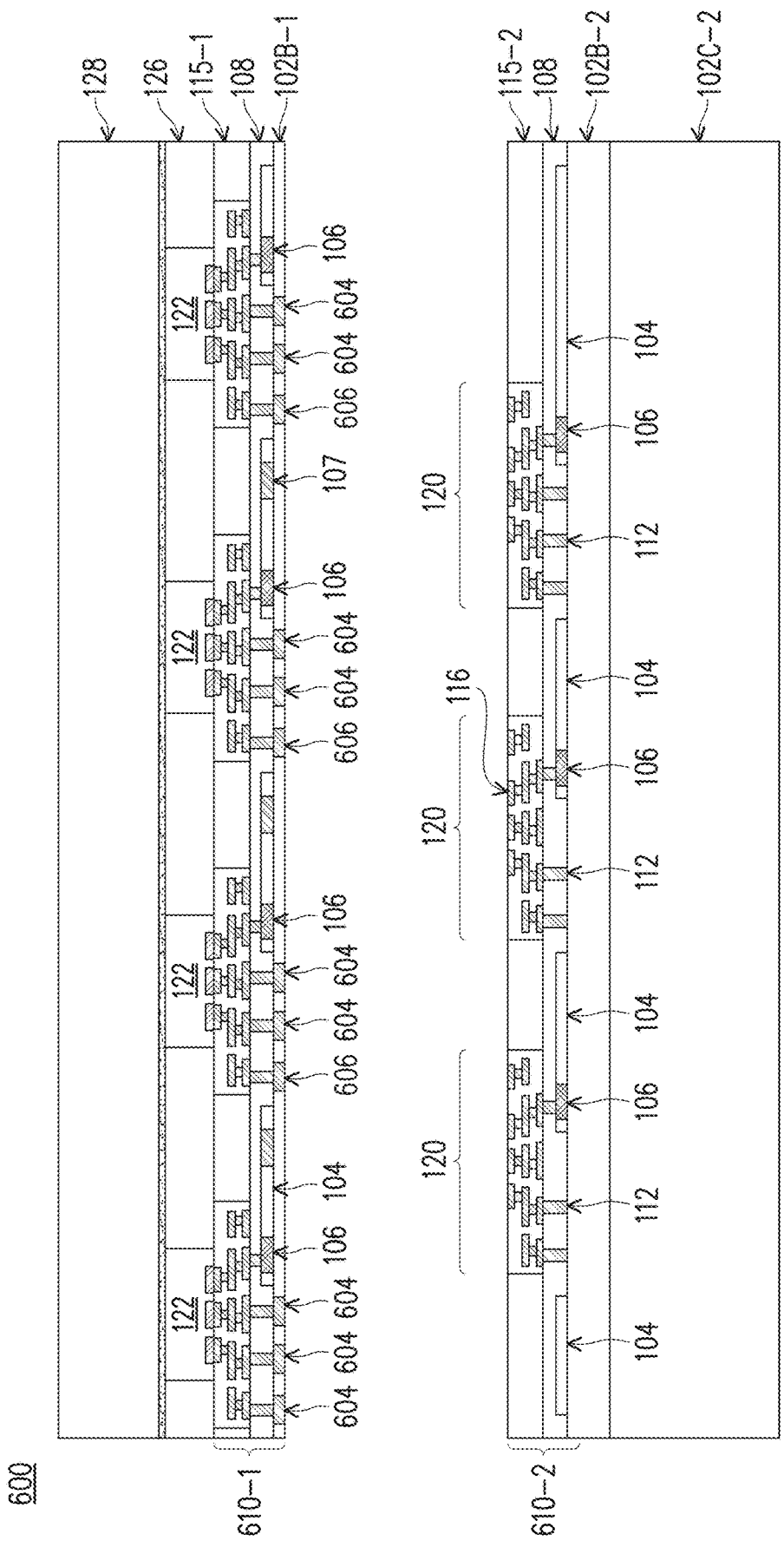

FIG. 34 shows the first hybrid interconnect structure 610-1 and a second hybrid interconnect structure 610-2, in accordance with some embodiments. The second hybrid interconnect structure 610-2 is similar to the first hybrid interconnect structure 610-1, and may be formed in a similar manner as described for FIGS. 29-31. For example, the second hybrid interconnect structure 610-2 may be formed on a BOX substrate 102-2 (not shown individually) that includes an oxide layer 102B-2 formed over a substrate 102C-2, and a silicon layer 102A-2 (not shown individually) formed over the oxide layer 102B-2. The silicon layer 102A-2 may be patterned to form waveguides 104 and photonic components 106 of the second hybrid interconnect structure 610-2. Vias 112 and contacts 113 may be formed, and redistribution structures 120 may be formed that are electrically connected to the vias 112 and contacts 113. Portions of the redistribution structures 120 may be replaced by a dielectric layer 115-2, and a planarization process may be performed to expose conductive pads 116 of the redistribution structures 120. The second hybrid interconnect structure 610-2 may have a different configuration of waveguides 104, redistribution structures 120, or other features than the first hybrid interconnect structure 610-1.

Figure 35:
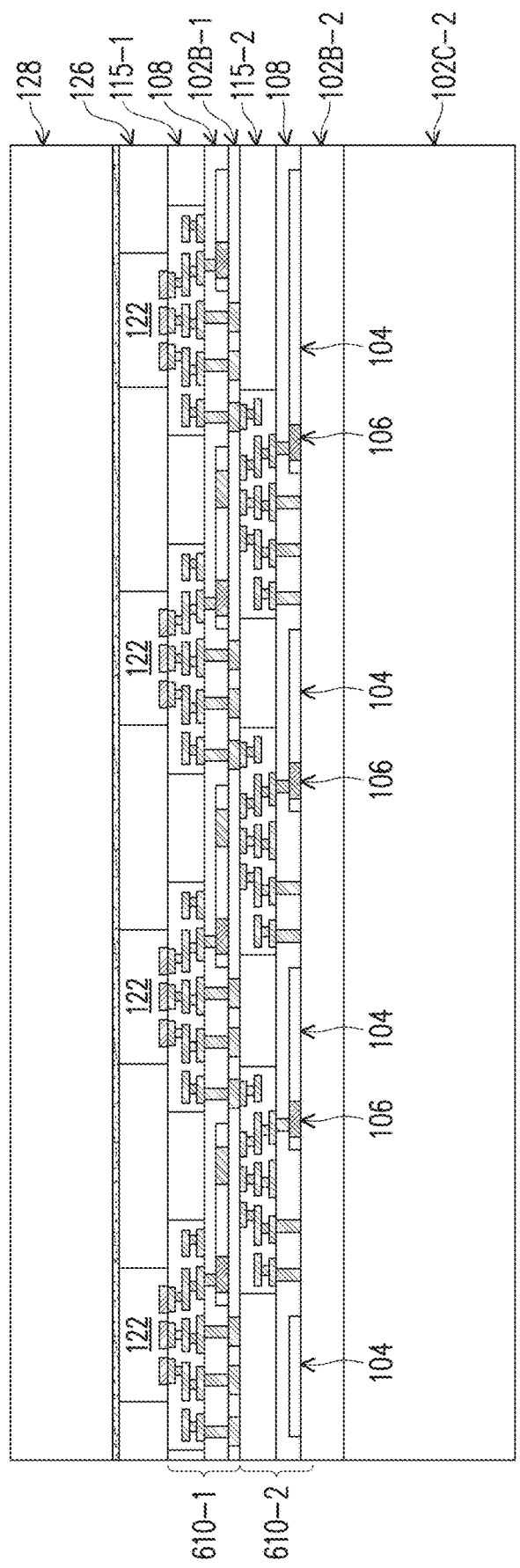

In FIG. 35, the second hybrid interconnect structure 610-2 is bonded to the first hybrid interconnect structure 610-1, in accordance with some embodiments. For example, the redistribution structures 120 and dielectric layer 115-2 of the second hybrid interconnect structure 610-2 may be bonded to the contact pads 606 and oxide layer 102B-1 of the first hybrid interconnect structure 610-1. The bonding process used may be dielectric-to-dielectric bonding and/or metal-to-metal bonding (e.g., direct bonding, fusion bonding, oxide-to-oxide bonding, hybrid bonding, or the like). In such embodiments, covalent bonds may be formed between oxide layers, such as the dielectric layer 115-2 and the oxide layer 102B-1. During the bonding, metal bonding may also occur between the conductive pads 116 of the redistribution structures 120 and the contact pads 606. In this manner, the second hybrid interconnect structure 610-2 is electrically connected to the first hybrid interconnect structure 610-1.

Figure 36:
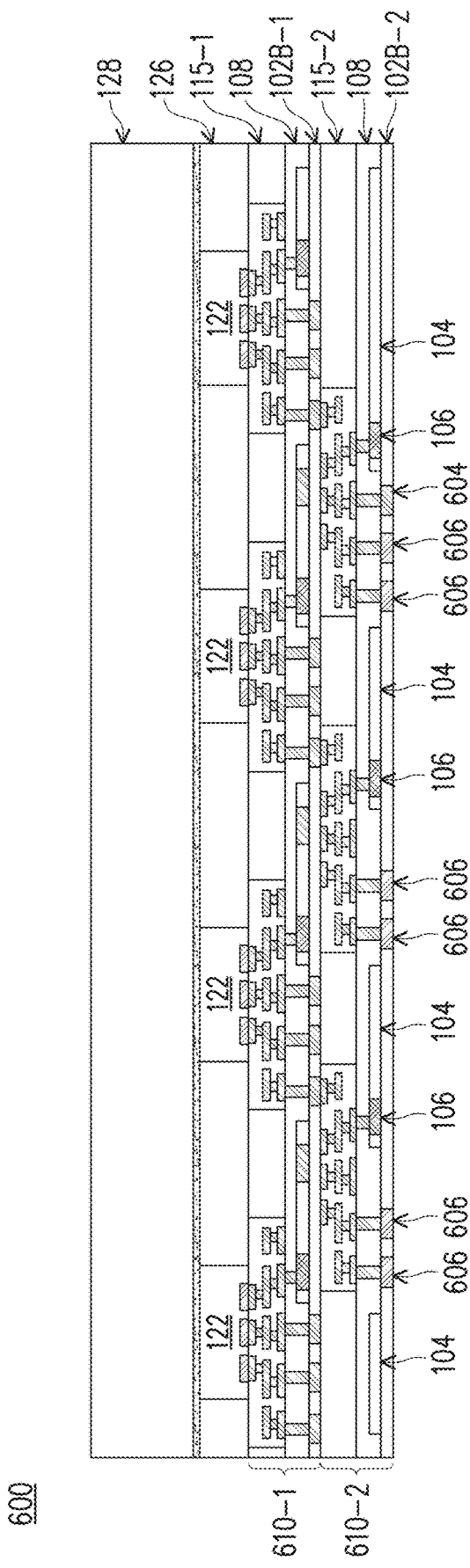

In FIG. 36, the substrate 102C-2 is removed and conductive lines 604 and contact pads 606 are formed, in accordance with some embodiments. In some embodiments, the oxide layer 102B-2 is also thinned. After removing the substrate 102C-2, conductive features are formed in the oxide layer 102B-2. The conductive features may include, for example, conductive lines 604 and/or contact pads 606.

Figure 37:
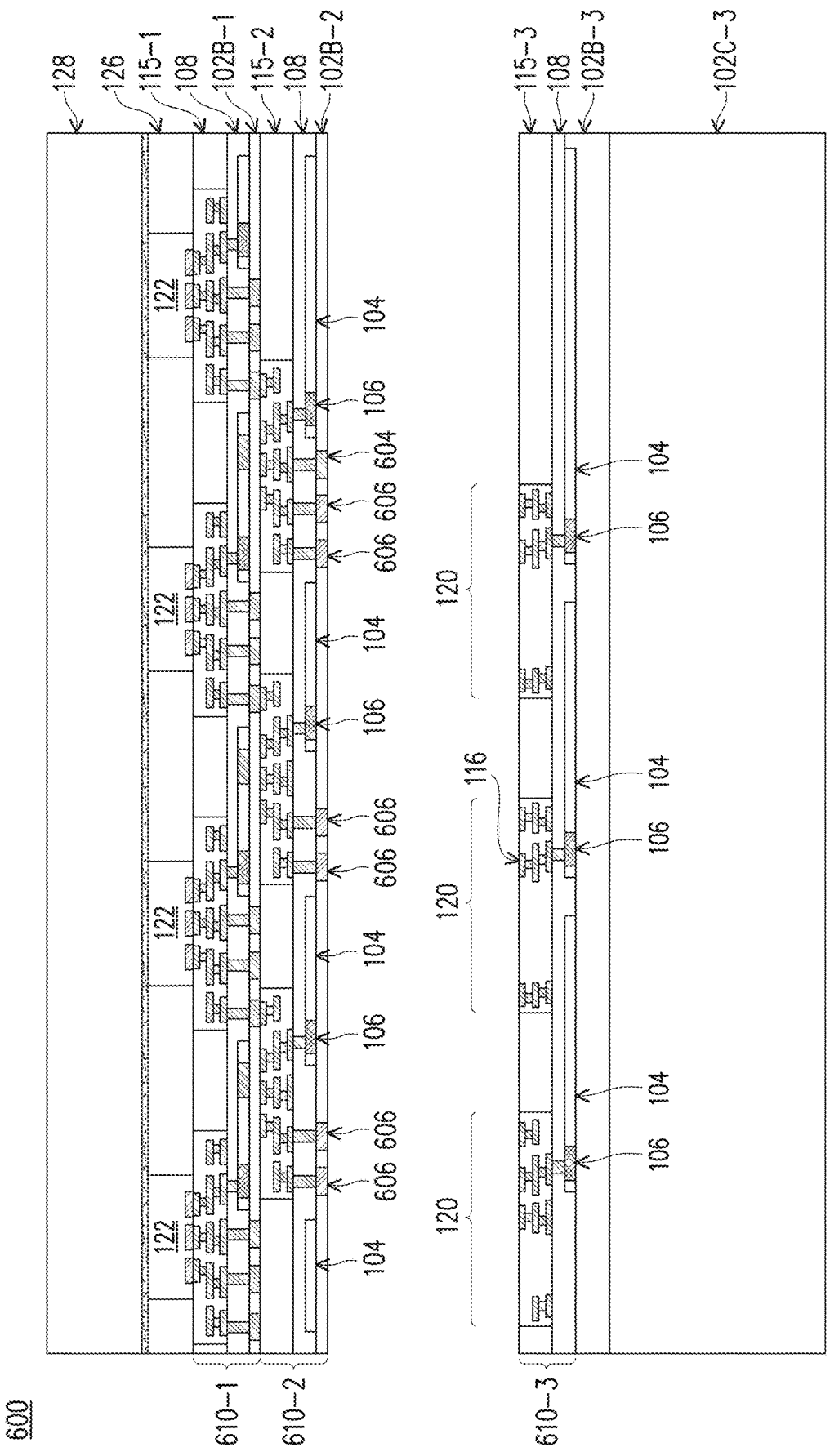

FIG. 34 shows the first hybrid interconnect structure 610-1, the second hybrid interconnect structure 610-2, and a third hybrid interconnect structure 610-3, in accordance with some embodiments. The third hybrid interconnect structure 610-3 is similar to the first hybrid interconnect structure 610-1, and may be formed in a similar manner as described for FIGS. 29-31. For example, the third hybrid interconnect structure 610-3 may be formed on a BOX substrate 102-3 (not shown individually) that includes an oxide layer 102B-3 formed over a substrate 102C-3, and a silicon layer 102A-3 (not shown individually) formed over the oxide layer 102B-3. The silicon layer 102A-3 may be patterned to form waveguides 104 and photonic components 106 of the third hybrid interconnect structure 610-3. Vias 112 and contacts 113 may be formed, and redistribution structures 120 may be formed that are electrically connected to the vias 112 and contacts 113. FIG. 37 shows an embodiment in which vias 112 are not formed in the third hybrid interconnect structure 610-3, but vias 112 may be formed in other embodiments. Portions of the redistribution structures 120 may be replaced by a dielectric layer 115-2, and a planarization process may be performed to expose conductive pads 116 of the redistribution structures 120. The third hybrid interconnect structure 610-3 may have a different configuration of waveguides 104, redistribution structures 120, or other features than the first hybrid interconnect structure 610-1 or the second hybrid interconnect structure 610-2.

Figure 38:
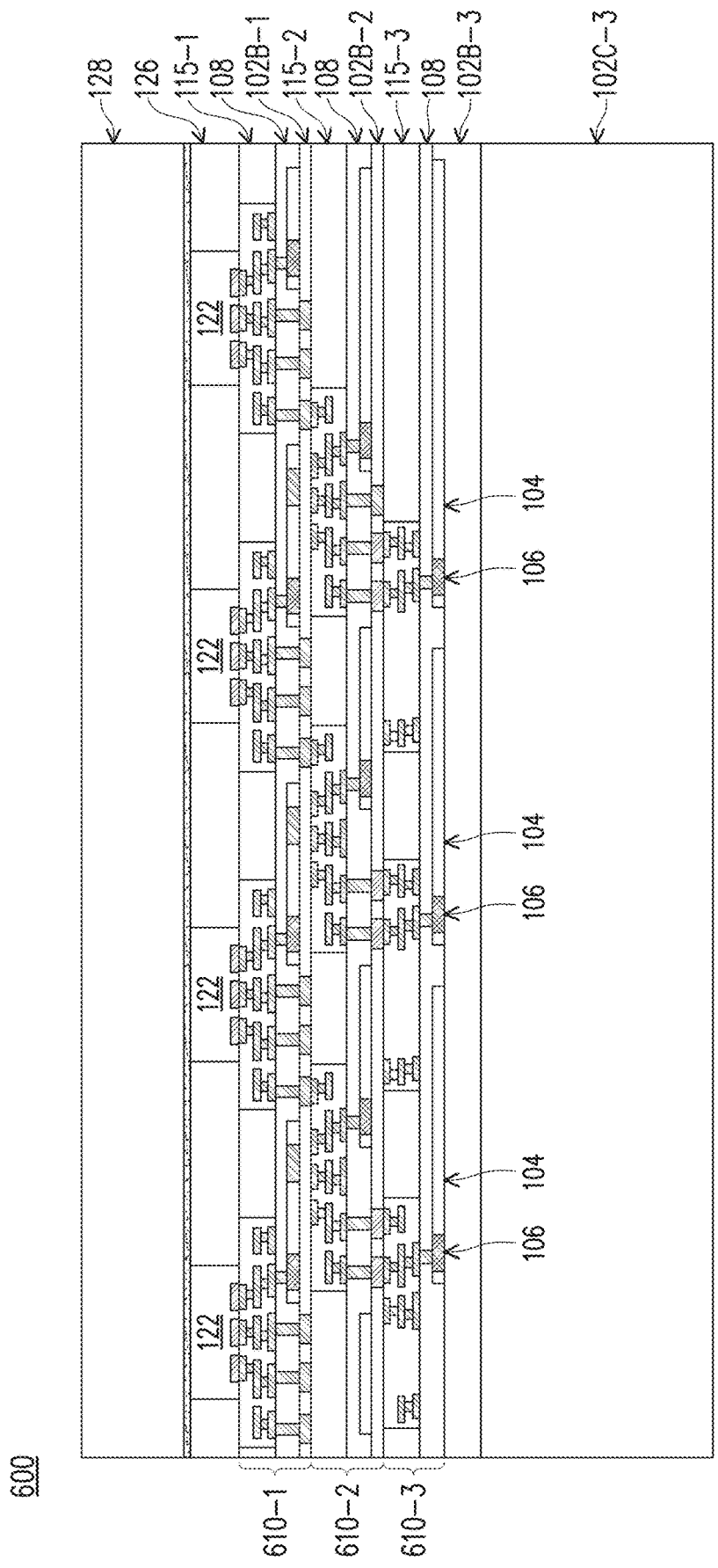

In FIG. 38, the third hybrid interconnect structure 610-3 is bonded to the second hybrid interconnect structure 610-2, in accordance with some embodiments. For example, the redistribution structures 120 and dielectric layer 115-3 of the third hybrid interconnect structure 610-3 may be bonded to the contact pads 606 and oxide layer 102B-1 of the second hybrid interconnect structure 610-2. The bonding process used may be dielectric-to-dielectric bonding and/or metal-to-metal bonding (e.g., direct bonding, fusion bonding, oxide-to-oxide bonding, hybrid bonding, or the like). In such embodiments, covalent bonds may be formed between oxide layers, such as the dielectric layer 115-3 and the oxide layer 102B-2. During the bonding, metal bonding may also occur between the conductive pads 116 of the redistribution structures 120 and the contact pads 606. In this manner, the third hybrid interconnect structure 610-3 is electrically connected to the second hybrid interconnect structure 610-2.

Figure 39:
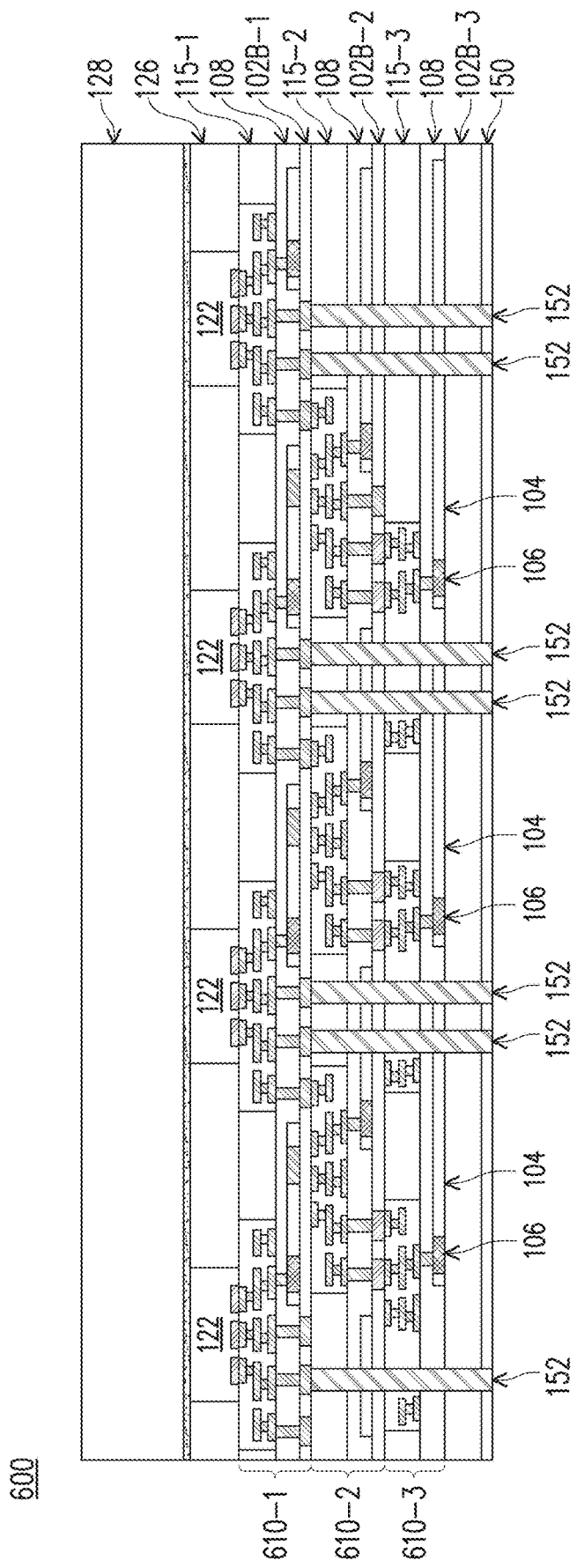

In FIG. 39, the substrate 102C-3 is removed and through vias 152 are formed, forming the photonic package 600, in accordance with some embodiments. Before forming the through vias 152, the substrate 102C-3 may be removed using a planarization process (e.g., a CMP or grinding process), an etching process, a combination thereof, or the like. In some embodiments, the oxide layer 102B-3 is also thinned. An optional passivation layer 150 may be formed over the oxide layer 102B-3, which may be similar to the passivation layer 150 described for FIG. 21.

The through vias 152 may be formed extending through the third hybrid interconnect structure 610-3 and the second hybrid interconnect structure 610-2 to make electrical connection to the first hybrid interconnect structure 610-1. For example, the through vias 152 may make physical and electrical contact with the conductive lines 604 of the first hybrid interconnect structure 610-1, as shown in FIG. 39. In some embodiments, the through vias 152 may make physical and electrical contact with contact pads 606 of the first hybrid interconnect structure 610-1. In other embodiments, the through vias 152 may make physical and electrical contact with vias 112 or redistribution structures 120 of the first hybrid interconnect structure 610-1. The through vias 152 may, for example, transmit electrical power or electrical signals to the electronic dies 122. The through vias 152 may transmit electrical power or electrical signals to components of the photonic package 600 such as the redistribution structures 120 and/or the photonic components 106 of each hybrid interconnect structure 610 (e.g., 610-1, 610-2, or 610-3) of the photonic package 600.

In this manner, a photonic package 600 comprising multiple hybrid interconnect structures 610 may be formed, in accordance with some embodiments. The photonic package 600 shown in FIG. 39 includes three hybrid interconnect structures 610 (e.g., 610-1, 610-2, and 610-3), but in other embodiments, a photonic package 600 may include more or fewer hybrid interconnect structures 610. In some embodiments, each hybrid interconnect structure 610 of the photonic package 600 includes both an electrical network provided by its redistribution structures 120 and an optical network provided by its waveguides 104. In some embodiments, optical signals within each hybrid interconnect structure 610 may be generated and/or detected by the photonic components 106, which may comprise modulators, photodetectors, or the like. By bonding the hybrid interconnect structures 610 in a stack as described herein, electrical power and electrical signals may be transmitted throughout the various components of photonic package 600. Additionally, the multiple optical networks provided by the hybrid interconnect structures 610 allow simultaneous (e.g., parallel) communication of optical signals throughout the photonic package 600. In this manner, the use of multiple hybrid interconnect structures 610 bonded together in a stack as described herein can improve the efficiency of a photonic package or a photonic system, such as the photonic system 700 described below for FIG. 40.

Figure 40:
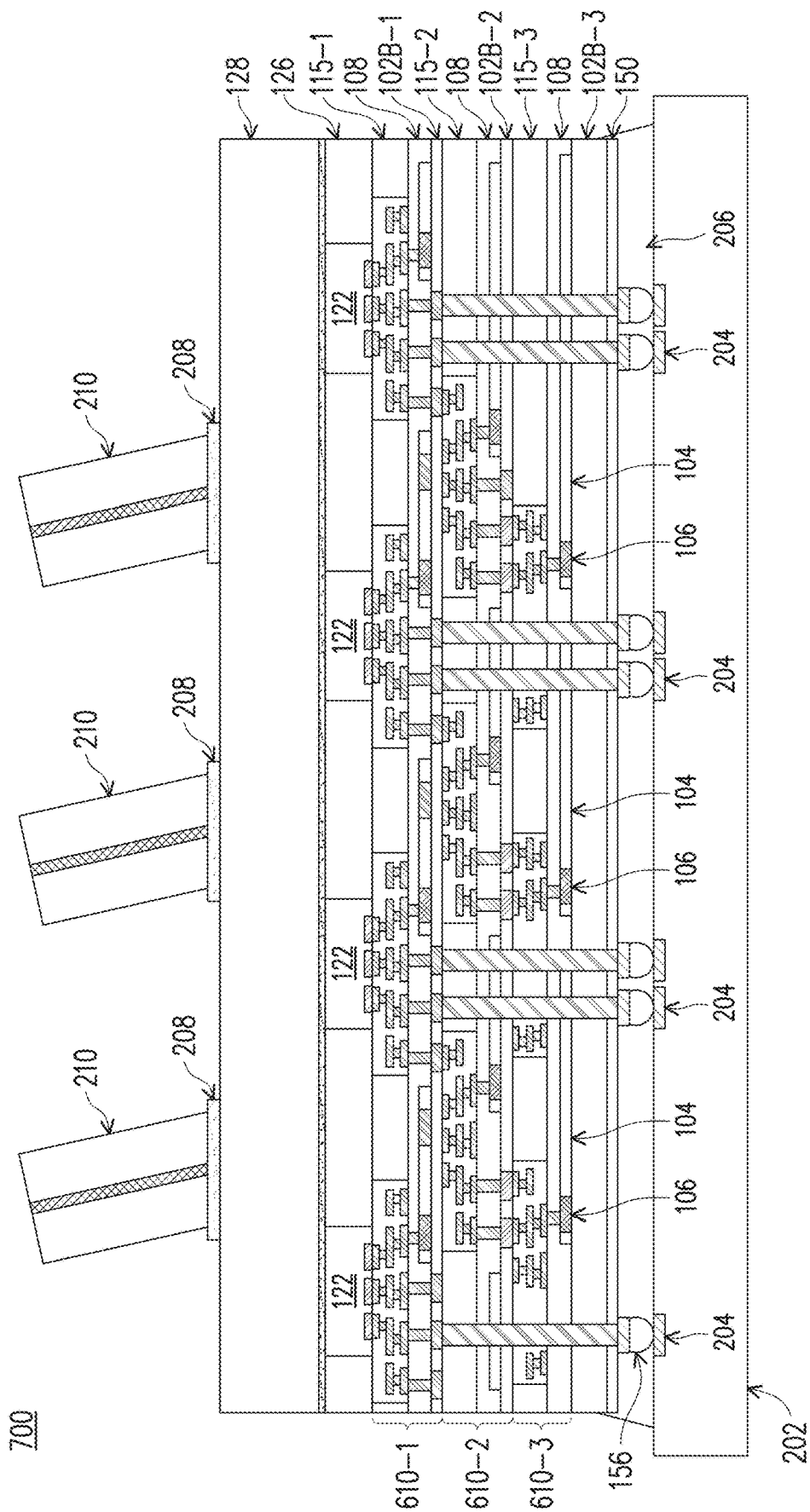
FIG. 40 illustrates a cross-sectional view of a photonic system, in accordance with some embodiments.

FIG. 40 illustrates the formation of a photonic system 700, in accordance with some embodiments. In FIG. 40, the photonic package 600 is attached to an interconnect substrate 202, in accordance with some embodiments. The interconnect substrate 202 may be similar to interconnect substrates 202 described previously, such as for FIG. 24. In some embodiments, the interconnect substrate 202 includes conductive pads 204 and conductive routing (e.g., conductive lines, vias, redistribution structures, or the like). The interconnect substrate 202 may include passive or active devices, in some embodiments. In some embodiments, the interconnect substrate 202 may be another type of structure, such as an integrated fan-out structure, a redistribution structure, or the like.

Prior to attachment, UBMs 154 and/or conductive connectors 156 may be formed for external connection to the through vias 152, in accordance with some embodiments. The conductive connectors 156 of the photonic package 600 may be bonded to the conductive pads 204 of the interconnect substrate 202, forming electrical connections between the photonic package 100 and the interconnect substrate 202. For example, the conductive connectors 156 of the photonic package 600 may be placed in physical contact with the conductive pads 204, and then a reflow process may be performed to bond solder material of the conductive connectors 156 to the conductive pads 204. In some embodiments, an underfill 206 may be formed between the photonic package 600 and the interconnect substrate 202. The UBMs 154, conductive connectors 156, or underfill 206 may be similar to those previously described in FIGS. 23-24, and may be formed in a similar manner.

Still referring to FIG. 40, the photonic package 600 of the photonic system 700 is shown coupled to optical fibers 210, in accordance with some embodiments. FIG. 40 shows the photonic package 100 coupled to multiple vertically-mounted optical fibers 210, though in other embodiments a different number of vertically-mounted optical fibers 210 may be used. In other embodiments, one or more edge-mounted optical fibers may be coupled to waveguides 104 of the hybrid interconnect structures 610. The optical fibers 210 may be mounted to the photonic package 600 using an optical glue 208 or the like. For example, the optical fibers 210 may be mounted to the support 128, as shown in FIG. 40.

In some embodiments, the vertically-mounted optical fibers 210 may be configured to optically couple to grating couplers 107 within the photonic package 600, such as the grating couplers 107 of the first hybrid interconnect structure 610-1. The vertically-mounted optical fibers 210 may be mounted at an angle with respect to the vertical axis or may be laterally offset from the grating coupler 107. The optical signals and/or optical power transmitted between the vertically-mounted optical fibers 210 and the grating couplers 107 are transmitted through the dielectric layer 108, the dielectric layers 115, the dielectric material 126, and the support 128 formed over the grating couplers 107. Optical signals and/or optical power may be transmitted from the optical fibers 210 to the grating couplers 107 of the first hybrid interconnect structure 610-1. The optical signals may be detected by photonic components 106, for example, and transmitted as electrical signals into the electronic dies 122. Optical signals generated within the waveguides 104 by a photonic component 106 comprising a modulator may similarly be transmitted from the grating coupler 107 to the vertically mounted optical fibers 210. In some cases, mounting the optical fibers 210 in a vertical orientation may allow for improved optical coupling, reduced processing cost, or greater design flexibility of a photonic package 600 or a photonic system 700.

Embodiments may achieve advantages. The embodiments described herein allow for a photonic system to be formed with less cost, larger size, and improved operation. By forming electrical and/or photonic components such as electrical routing, laser diodes, heaters, nitride waveguides, or other components beneath the silicon waveguides, the flexibility of design may be improved. For example, by forming the components beneath the silicon waveguides, the sizes and configurations of components are not restricted by the presence of Back End of Line (BEOL) structures formed above the silicon waveguides. Thus, more options are available for the sizes and configurations of the components beneath the silicon waveguides as well as for features formed above the silicon waveguides, such as redistribution structures. In some cases, components may be formed beneath the silicon waveguides without requiring difficult Back End of Line (BEOL) processing steps such as selective removal or refill processes.

In some cases, the formation of one or more hybrid interconnect structures to both electrically and optically communicate signals can allow increased device performance of a photonic system. Additionally, hybrid interconnect structures may include optical networks comprising silicon waveguides and silicon nitride waveguides. Transmitting optical signals within a photonic system may allow for communication at greater speed, with less signal attenuation at high frequencies, lower crosstalk, and less switching noise than transmitting electrical signals with e.g., conductive lines and the like. Optical communication in this manner may allow for lower-latency and higher-bandwidth communication. In some embodiments, a photonic system may include several hybrid interconnect structures that allow for parallel communication on the electrical and optical networks of each hybrid interconnect structure.

In accordance with an embodiment, a method includes patterning a silicon layer to form a first waveguide, wherein the silicon layer is on a first side of a buried oxide layer, wherein the buried oxide layer is over a substrate; forming a first redistribution structure over the first waveguide; bonding a first semiconductor die to the first redistribution structure; removing the substrate to expose a second side of the buried oxide layer, wherein the second side of the buried oxide layer is opposite the first side of the buried oxide layer; forming a second waveguide on the second side of the buried oxide layer; forming a first dielectric layer over the second waveguide and over the second side of the buried oxide layer; and forming a through via extending through the first dielectric layer to electrically and physically contact the first redistribution structure. In an embodiment, the method includes forming a laser diode over the second side of the buried oxide layer, wherein the laser diode is optically coupled to the first waveguide. In an embodiment, the method includes forming a photodetector on the first side of the buried oxide layer, wherein the photodetector is optically coupled to the first waveguide, wherein the photodetector is electrically connected to the redistribution structure. In an embodiment, the method includes patterning the silicon layer to form a grating coupler, wherein the grating coupler is optically coupled to the first waveguide. In an embodiment, the method includes attaching a support structure over the first semiconductor die and over the first side of the buried oxide layer. In an embodiment, the method includes attaching an optical fiber to the support structure, wherein the optical fiber is optically coupled to the first waveguide through the support structure. In an embodiment, the second waveguide includes silicon nitride. In an embodiment, the method includes forming a metal heater on the first dielectric layer, wherein the metal heater is electrically connected to the through via. In an embodiment, the method includes forming a third waveguide on the first dielectric layer and forming a second dielectric layer on the third waveguide and over the first dielectric layer.

In accordance with an embodiment, a method includes forming a first hybrid interconnect structure on a first substrate, which includes: patterning a first silicon layer of the first substrate to form first waveguides, wherein the first silicon layer is on a first oxide layer of the first substrate; forming at least one first photonic device in the first waveguides; forming first redistribution structures over the first oxide layer, wherein at least one of the first redistribution structures is electrically connected to the at least one first photonic device; bonding semiconductor devices to the first redistribution structures, wherein the semiconductor devices are electrically connected to the first redistribution structures; and forming first contact pads in the first oxide layer, wherein the first contact pads are electrically connected to the first redistribution structures; forming a second hybrid interconnect structure on a second substrate, which includes: patterning a second silicon layer of the second substrate to form second waveguides, wherein the second silicon layer is on a second oxide layer of the second substrate; forming at least one second photonic device in the second waveguides; and forming second redistribution structures over the second oxide layer, wherein at least one of the second redistribution structures is electrically connected to the at least one second photonic device; and bonding the second hybrid interconnect structure to the first hybrid interconnect structure, which includes bonding the second redistribution structures to the first contact pads, wherein the second redistribution structures are physically and electrically connected to the first contact pads. In an embodiment, the method includes forming through vias extending through the second hybrid interconnect structure, wherein the through vias are physically and electrically connected to the first hybrid interconnect structure. In an embodiment, at least one first photonic device and at least one second photonic device include optical modulators. In an embodiment, the method includes patterning the first silicon layer of the first substrate to form grating couplers. In an embodiment, the method includes attaching a support structure to the semiconductor devices and attaching optical fibers to the support structure, wherein the optical fibers are coupled to the grating couplers. In an embodiment, the second hybrid interconnect structure is bonded to the first hybrid interconnect structure using a direct bonding process. In an embodiment, the method includes bonding a third hybrid interconnect structure to the second hybrid interconnect structure, which includes bonding third redistribution structures of the third hybrid interconnect structure to second contact pads of the second hybrid interconnect structure.

In accordance with an embodiment, a package includes silicon waveguides on a first side of an oxide layer; photonic devices on the first side of the oxide layer, wherein the photonic devices are coupled to the silicon waveguides; redistribution structures over the first side of the oxide layer, wherein the redistribution structures are electrically connected to the photonic devices; a hybrid interconnect structure on a second side of the oxide layer, wherein the hybrid interconnect structure includes a stack of silicon nitride waveguides that are separated by dielectric layers; and through vias extending through the hybrid interconnect structure and the oxide layer, wherein the through vias make physical and electrical connection to the redistribution structures. In an embodiment, the package includes first semiconductor devices attached to the redistribution structures, wherein the first semiconductor devices are physically and electrically connected to the redistribution structures. In an embodiment, the package includes second semiconductor devices attached to a side of the hybrid interconnect structure that is opposite the oxide layer, wherein the first semiconductor devices are physically and electrically connected to the through vias. In an embodiment, the package includes a support structure over the first side of the oxide layer and a thermal module attached to the support structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a first oxide layer;
a plurality of first silicon waveguides on the first oxide layer;
a plurality of first photonic devices on the first oxide layer;
a plurality of first redistribution structures over the plurality of first silicon waveguides and plurality of first photonic devices, wherein the first redistribution structures are electrically coupled to the first photonic devices;
a second oxide layer over the plurality of first redistribution structures;
a plurality of second silicon waveguides on the second oxide layer;
a plurality of second photonic devices on the second oxide layer;
a plurality of second redistribution structures over the plurality of second silicon waveguides and plurality of second photonic devices, wherein the second redistribution structures are electrically coupled to the second photonic devices and to the first redistribution structures; and
a plurality of semiconductor dies bonded to the plurality of second redistribution structures.

2. The package of claim 1 further comprising a plurality of through vias extending through the second oxide layer and the first oxide layer, wherein the through vias are electrically coupled to the second redistribution structures.

3. The package of claim 1, wherein the second redistribution structures at least partially overlap the first redistribution structures.

4. The package of claim 1, wherein the first photonic devices comprise laser diodes.

5. The package of claim 1, wherein the first photonic devices comprise optical modulators.

6. The package of claim 1, wherein the second silicon waveguides comprise at least one grating coupler.

7. The package of claim 1 further comprising a plurality of optical fibers over the plurality of semiconductor dies, wherein the optical fibers are optically coupled to the second silicon waveguides.

8. A package comprising:
a plurality of first waveguides on a first side of an oxide layer;
a first photonic device on the first side of the oxide layer;
a redistribution structure over the plurality of first waveguides and over the first side of the oxide layer, wherein the redistribution structure is electrically connected to the first photonic device;
a semiconductor die bonded to the redistribution structure and over the first side of the oxide layer;
a plurality of second waveguides on a second side of the oxide layer, wherein the first waveguides are a different material than the second waveguides, wherein at least one second waveguide is optically coupled to at least one first waveguide; and
a second photonic device on the second side of the oxide layer.

9. The package of claim 8, wherein the second photonic device is a laser diode.

10. The package of claim 8, wherein the first waveguides are silicon and the second waveguides are silicon nitride.

11. The package of claim 8 further comprising a plurality of third waveguides over the plurality of second waveguides and over the second side of the oxide layer, wherein the at least one second waveguide is optically coupled to at least one third waveguide.

12. The package of claim 8 further comprising a metal heater adjacent to the second waveguide.

13. A package comprising:
a first hybrid interconnect structure on a first substrate, the first hybrid interconnect structure comprising:
a first plurality of waveguides, wherein the first plurality of waveguides is on a first oxide layer of the first substrate;
at least one first photonic device in the first plurality of waveguides;

a first plurality of redistribution structures over the first oxide layer, wherein at least one of the first plurality of redistribution structures is electrically connected to the at least one first photonic device;

a plurality of semiconductor devices bonded to the first plurality of redistribution structures, wherein the plurality of semiconductor devices are electrically connected to the first plurality of redistribution structures; and a first plurality of contact pads in the first oxide layer, wherein the first plurality of contact pads are electrically connected to the first plurality of redistribution structures;

a second hybrid interconnect structure on a second substrate, the second hybrid interconnect structure comprising:

a second plurality of waveguides, wherein the second plurality of waveguides is on a second oxide layer of the second substrate;

at least one second photonic device in the second plurality of waveguides; and a second plurality of redistribution structures over the second oxide layer, wherein at least one of the second plurality of redistribution structures is electrically connected to the at least one second photonic device; and the second hybrid interconnect structure being bonded to the first hybrid interconnect structure, the second plurality of redistribution structures being bonded to the first plurality of contact pads, wherein the second plurality of redistribution structures are physically and electrically connected to the first plurality of contact pads.

14. The package of claim 13, further comprising a plurality of through vias extending through the second hybrid interconnect structure, wherein the plurality of through vias are physically and electrically connected to the first hybrid interconnect structure.

15. The package of claim 13, wherein the at least one first photonic device and the at least one second photonic device comprise optical modulators.

16. The package of claim 13, further comprising patterning a first silicon layer of the first substrate to form a plurality of grating couplers.

17. The package of claim 16, further comprising:

a support structure attached to the plurality of semiconductor devices; and a plurality of optical fibers attached to the support structure, wherein the plurality of optical fibers are coupled to the plurality of grating couplers.

18. The package of claim 13, wherein the second hybrid interconnect structure is bonded to the first hybrid interconnect structure using a direct bonding process.

19. The package of claim 13, further comprising a third hybrid interconnect structure bonded to the second hybrid interconnect structure, wherein a third plurality of redistribution structures of the third hybrid interconnect structure is bonded to a second plurality of contact pads of the second hybrid interconnect structure.

20. The package of claim 13, wherein the at least one first photonic device and the at least one second photonic device comprise photodetectors.

* * * * *